(12) United States Patent
Kim et al.

(10) Patent No.: US 12,068,337 B2
(45) Date of Patent: Aug. 20, 2024

(54) IMAGE SENSOR

(71) Applicant: SAMSUNG ELECTRONICS CO., LTD., Suwon-si (KR)

(72) Inventors: Kook-tae Kim, Hwaseong-si (KR); Jin-gyun Kim, Hwaseong-si (KR); Soo-jin Hong, Guri-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/144,969

(22) Filed: May 9, 2023

(65) Prior Publication Data

US 2023/0275104 A1 Aug. 31, 2023

Related U.S. Application Data

(63) Continuation of application No. 17/519,701, filed on Nov. 5, 2021, now Pat. No. 11,652,113, which is a continuation of application No. 16/451,412, filed on Jun. 25, 2019, now Pat. No. 11,239,269.

(30) Foreign Application Priority Data

Nov. 6, 2018 (KR) .......................... 10-2018-0135331

(51) Int. Cl.
 *H01L 27/146* (2006.01)
 *H04N 25/40* (2023.01)

(52) U.S. Cl.
 CPC ....... *H01L 27/14605* (2013.01); *H04N 25/40* (2023.01)

(58) Field of Classification Search
 None
 See application file for complete search history.

(56) References Cited

U.S. PATENT DOCUMENTS

| | | | |
|---|---|---|---|
| 6,444,390 | B1 | 9/2002 | Yamazaki et al. |
| 9,054,003 | B2 | 6/2015 | Ahn et al. |
| 9,160,949 | B2 | 10/2015 | Zhang et al. |
| 9,425,231 | B2 | 8/2016 | Kim et al. |
| 9,564,463 | B2 | 2/2017 | Ihara |
| 9,620,546 | B2 | 4/2017 | Chung et al. |

(Continued)

FOREIGN PATENT DOCUMENTS

| | | |
|---|---|---|
| CN | 106856201 A | 6/2017 |
| CN | 107068609 A | 8/2017 |

(Continued)

OTHER PUBLICATIONS

Chinese Office Action dated May 31, 2023 for corresponding Application No. 201911068784.0.

(Continued)

*Primary Examiner* — Telly D Green
(74) *Attorney, Agent, or Firm* — Muir Patent Law, PLLC

(57) ABSTRACT

An image sensor including a semiconductor substrate having a first surface and a second surface; and a pixel isolation film extending from the first surface of the semiconductor substrate into the semiconductor substrate and defining active pixels in the semiconductor substrate, wherein the pixel isolation film includes a buried conductive layer including polysilicon containing a fining element at a first concentration; and an insulating liner between the buried conductive layer and the semiconductor substrate, and wherein the fining element includes oxygen, carbon, or fluorine.

20 Claims, 31 Drawing Sheets

(56) References Cited

U.S. PATENT DOCUMENTS

| | | |
|---|---|---|
| 9,666,624 B2 | 5/2017 | Lin et al. |
| 10,304,887 B2 | 5/2019 | Kim et al. |
| 10,748,955 B2 | 8/2020 | Oh et al. |
| 11,239,269 B2 | 2/2022 | Kim et al. |
| 2008/0102557 A1 | 5/2008 | Kim et al. |
| 2011/0079857 A1 | 4/2011 | Lee et al. |
| 2012/0043600 A1 | 2/2012 | Van der Vegt et al. |
| 2012/0098078 A1 | 4/2012 | Shim et al. |
| 2013/0171807 A1 | 7/2013 | Yoo et al. |
| 2013/0249061 A1 | 9/2013 | Murakoshi |
| 2014/0374868 A1 | 12/2014 | Lee et al. |
| 2015/0115388 A1 | 4/2015 | Eda et al. |
| 2015/0243694 A1 | 8/2015 | Ihara |
| 2016/0064430 A1 | 3/2016 | Lee et al. |
| 2016/0172391 A1 | 6/2016 | Ihara |
| 2017/0040358 A1 | 2/2017 | Kim et al. |
| 2017/0170229 A1 | 6/2017 | Oh et al. |
| 2017/0221983 A1 | 8/2017 | Srinivasan et al. |
| 2018/0190691 A1 | 7/2018 | Lee et al. |

FOREIGN PATENT DOCUMENTS

| | | |
|---|---|---|
| CN | 108695346 A | 10/2018 |
| KR | 10-2012-0121176 A | 11/2012 |
| KR | 10-2013-0128992 A | 11/2013 |
| KR | 10-2014-0119648 A | 10/2014 |
| KR | 10-2015-0101681 | 9/2015 |
| KR | 10-2016-0026299 A | 3/2016 |

OTHER PUBLICATIONS

Korean Office Action dated Apr. 22, 2023 for corresponding Application No. 10-2018-0135331.

Notice of Allowance, dated Sep. 26, 2023, for corresponding Korean Patent Application No. 10-2018-0135331.

Office Action, dated Nov. 22, 2023, for corresponding CN Patent Application No. 201911068784.0.

Third Office Action dated May 31, 2024 for corresponding CN Patent Application No. 201911068784.0.

II-II'

II-II'

II-II'

II-II'

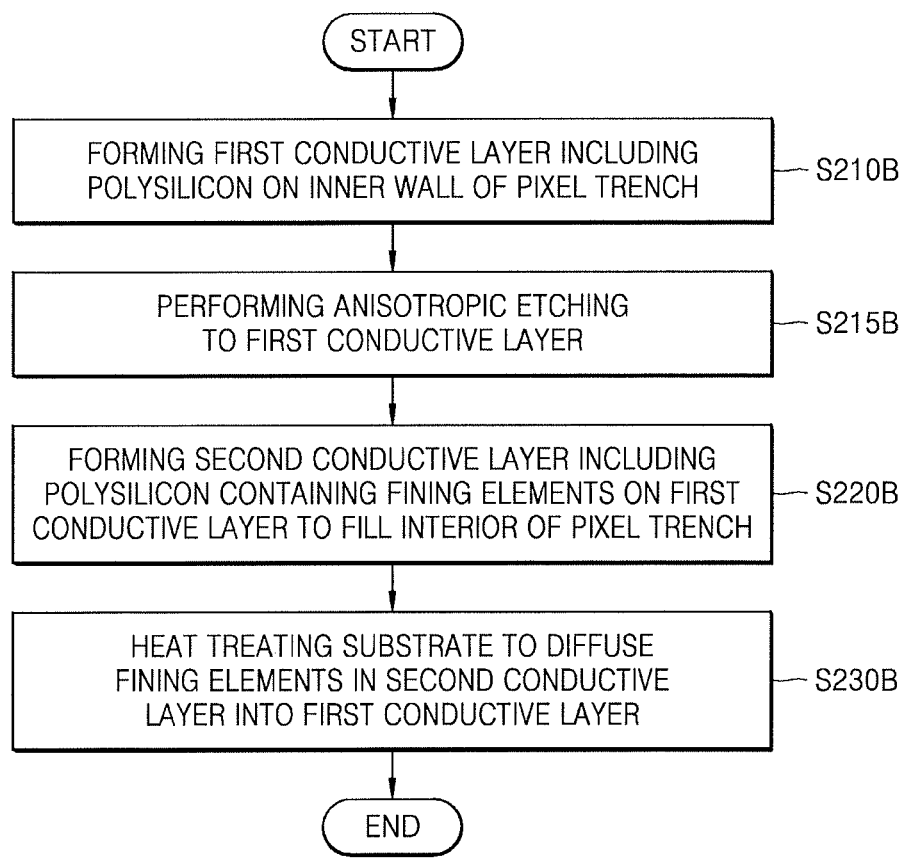

IMAGE SENSOR

CROSS-REFERENCE TO RELATED APPLICATIONS

This is a continuation application based on pending application Ser. No. 17/519,701, filed Nov. 5, 2021, which in turn is a continuation of application Ser. No. 16/451,412, filed Jun. 25, 2019, now U.S. Pat. No. 11,239,269 B2, issued Feb. 1, 2022, the entire contents of both being hereby incorporated by reference.

Korean Patent Application No. 10-2018-0135331, filed on Nov. 6, 2018, in the Korean Intellectual Property Office, and entitled: "Image Sensors," is incorporated by reference herein in its entirety.

BACKGROUND

1. Field

Embodiments relate to an image sensor.

2. Description of the Related Art

An image sensor is a device that converts an optical image signal into an electric signal. The image sensor may include pixel region including a plurality of photodiode regions in which incident light is received and converted into the electrical signal, and a pixel isolation region for electrically separating pixels from each other.

SUMMARY

The embodiments may be realized by providing an image sensor including a semiconductor substrate having a first surface and a second surface; and a pixel isolation film extending from the first surface of the semiconductor substrate into the semiconductor substrate and defining active pixels in the semiconductor substrate, wherein the pixel isolation film includes a buried conductive layer including polysilicon containing a fining element at a first concentration; and an insulating liner between the buried conductive layer and the semiconductor substrate, and wherein the fining element includes oxygen, carbon, or fluorine.

The embodiments may be realized by providing an image sensor including a semiconductor substrate; and a pixel isolation film in a pixel trench passing through the semiconductor substrate and defining active pixels in the semiconductor substrate, wherein the pixel isolation film includes an insulating liner on a sidewall of the pixel trench; and a buried conductive layer filled in an inside of the pixel trench on the insulating liner, the buried conductive layer including polysilicon containing a fining element at a first concentration, and wherein the fining element includes oxygen, carbon, or fluorine.

The embodiments may be realized by providing an image sensor including a semiconductor substrate including a plurality of active pixels; and a pixel isolation film between active pixels of the plurality of active pixels and in a pixel trench passing through the semiconductor substrate, wherein the pixel isolation film includes: an insulating liner on a sidewall of the pixel trench; and a buried conductive layer filled in an inside of the pixel trench on the insulating liner, the buried conductive layer including polysilicon containing a fining element at a first concentration, and wherein the fining element includes oxygen and the first concentration is about 5 at % to about 40 at %.

BRIEF DESCRIPTION OF THE DRAWINGS

Features will be apparent to those of skill in the art by describing in detail exemplary embodiments with reference to the attached drawings in which:

FIG. 11 illustrates a flowchart of a method of manufacturing an image sensor according to example embodiments;

DETAILED DESCRIPTION

Figure 1:
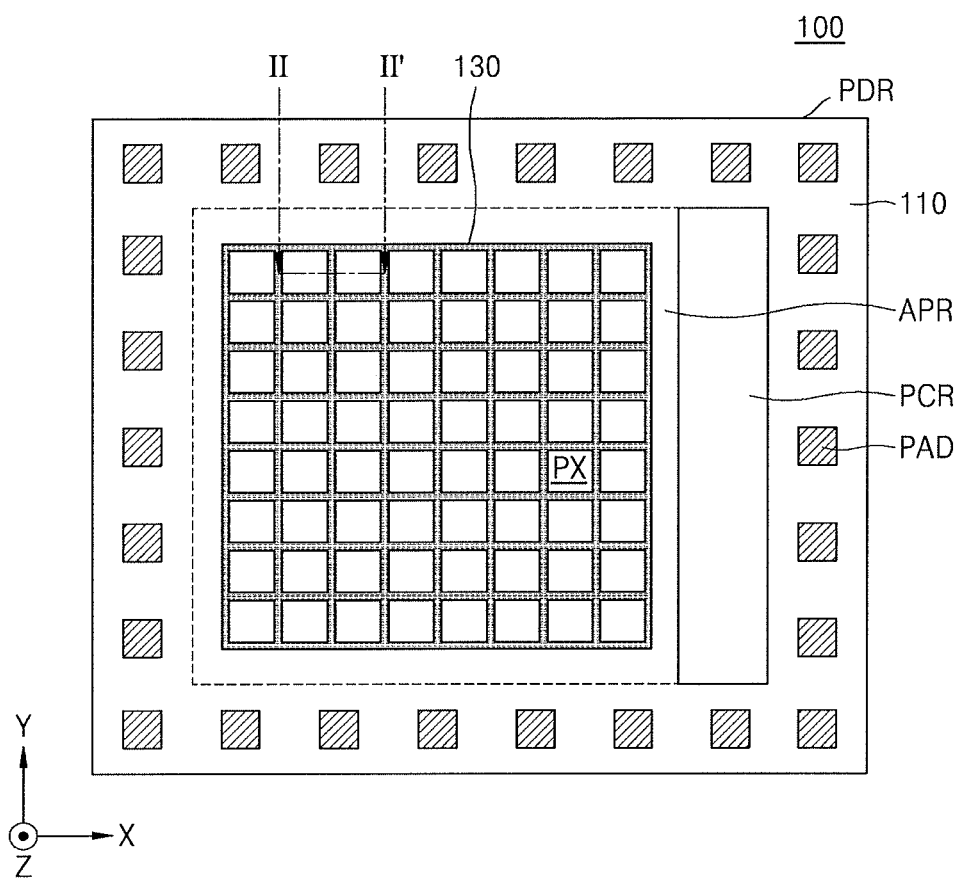
FIG. 1 illustrates a layout view of an image sensor according to example embodiments.
Figure 2:
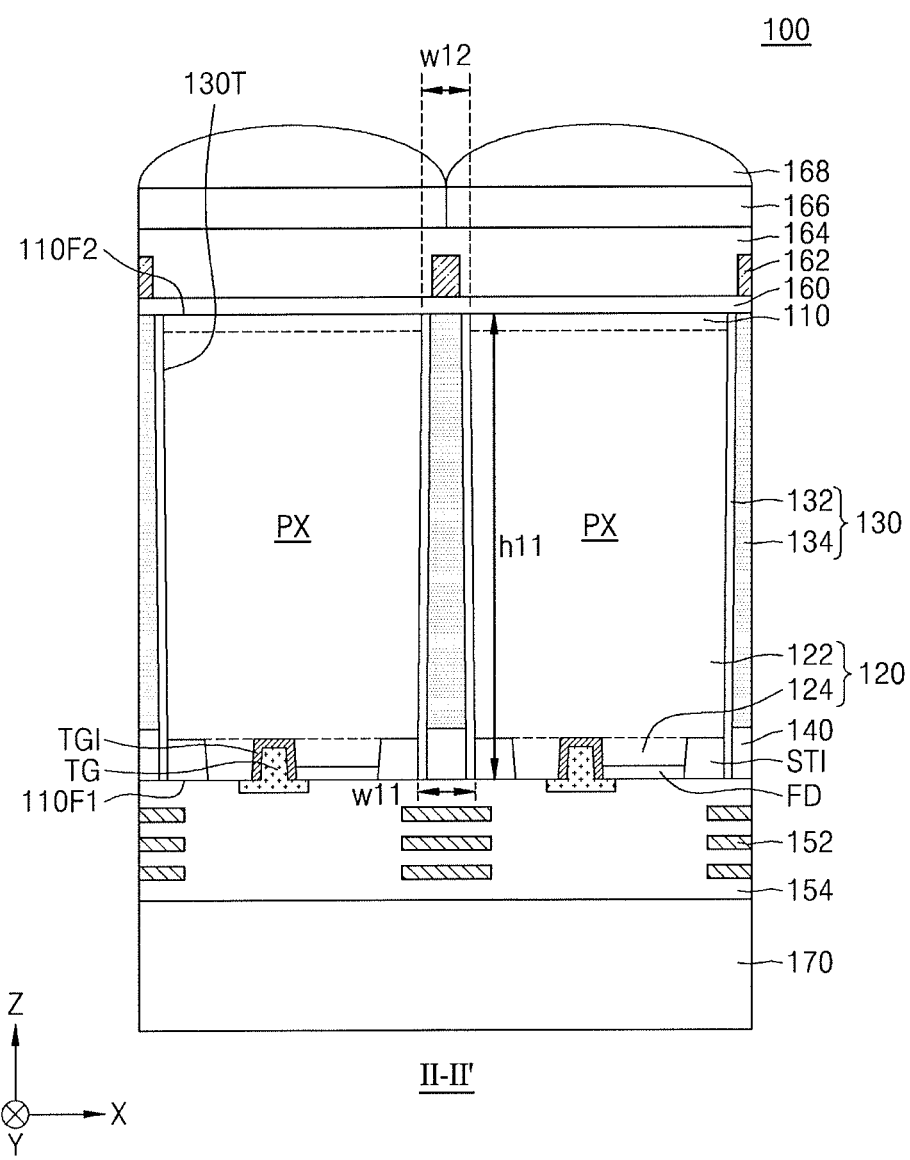
FIG. 2 illustrates a cross-sectional view taken along line II-II' of FIG. 1.

FIG. 1 illustrates a layout diagram of an image sensor 100 according to example embodiments. FIG. 2 illustrates a cross-sectional view taken along line II-II' of FIG. 1.

Referring to FIGS. 1 and 2, the image sensor 100 may include an active pixel region APR, a peripheral circuit region PCR, and a pad region PDR in or on a semiconductor substrate 110.

The active pixel region APR may include a plurality of active pixels PX and each of a plurality of photoelectric conversion regions 120 may be arranged in each of the plurality of active pixels PX. In the active pixel region APR, a plurality of active pixels PX may be arranged in a matrix shape in the form of rows and columns along first direction (for example, X direction in FIG. 1) parallel to an upper surface of the semiconductor substrate 110 and second direction (for example, Y direction in FIG. 1) parallel to the upper surface of the semiconductor substrate 110.

In an implementation, as illustrated, the peripheral circuit region PCR may be on one side of the active pixel region APR in a plan view. In an implementation, the peripheral circuit region PCR may surround an entirety of the active pixel region APR. In an implementation, unlike that shown in FIG. 1, the peripheral circuit region PCR may be on an additional substrate, and then the additional substrate may be attached to the semiconductor substrate 110.

The peripheral circuit region PCR may be a region where various kinds of circuits for controlling a plurality of active pixels PX in the active pixel region APR are formed. For example, the peripheral circuit region PCR may include a plurality of transistors, and the plurality of transistors may be driven to provide a constant signal in each photoelectric conversion region 120 of the active pixel region APR, or to control an output signal from each of the photoelectric conversion region 120. In an implementation, the transistor may configure various logic circuits, such as a timing generator, a row decoder, a row driver, a correlated double sampler CDS, an analog to digital converter ADC, a latch, a column decoder, and the like.

The pad region PDR may surround the active pixel region APR and the peripheral circuit region PCR. A conductive pad PAD may be on the peripheral region of the semiconductor substrate 110 and may be electrically connected to circuits in the plurality of active pixels PX and the peripheral circuit region PCR. The conductive pad PAD may function as a connection terminal for externally supplying power and signals to a circuit included in the plurality of active pixels PX and the peripheral circuit region PCR.

The semiconductor substrate 110 may include a first surface 110F1 and a second surface 110F2 opposing to each other. Herein, for convenience, the surface of the semiconductor substrate 110 on which a microlens 168 is arranged is referred to as the second surface 110F2, and the surface opposite to the second surface 110F2 is referred to as the first surface 110F1.

In an implementation, the semiconductor substrate 110 may include a P-type semiconductor substrate. For example, the semiconductor substrate 110 may be a P-type silicon substrate. In an implementation, the semiconductor substrate 110 may include a P-type bulk substrate and a P-type or a N-type epitaxial layer grown thereon. In an implementation ts, the semiconductor substrate 110 may include an N-type bulk substrate and a P-type or an N-type epitaxial layer grown thereon. In an implementation, the semiconductor substrate 110 may be formed of an organic plastic substrate.

A plurality of active pixels PX may be arranged in a matrix form in the semiconductor substrate 110 in the active pixel region APR. One of the photoelectric conversion regions 120 may be arranged in each of the plurality of active pixels PX. Each of the plurality of photoelectric conversion regions 120 may include a photodiode region 122 and a well region 124.

A pixel isolation film 130 may be in the semiconductor substrate 110 in the active pixel region APR, and the plurality of active pixels PX may be defined by the pixel isolation film 130. The pixel isolation film 130 may be between one of the plurality of photoelectric conversion regions 120 and another one of the photoelectric conversion regions 120 adjacent thereto. The one of the photoelectric conversion regions 120 and the other one of the photoelectric conversion regions 120 adjacent thereto may be physically and electrically separated by the pixel isolation film 130. The pixel isolation film 130 may be between each of the plurality of photoelectric conversion regions 120 arranged in a matrix form and may have a grid or mesh shape in a plan view.

The pixel isolation film 130 may be in a pixel trench 130T passing through the semiconductor substrate 110 from the first surface 110F1 to the second surface 110F2 of the semiconductor substrate 110. The pixel isolation film 130 may include an insulating liner 132 conformally formed on a sidewall of the pixel trench 130T and a buried conductive layer 134 filled in an inside of the pixel trench 130T on the insulating liner 132.

In an implementation, the insulating liner 132 may include a metal oxide, e.g., hafnium oxide, aluminum oxide, tantalum oxide, or the like. In an implementation, the insulating liner 132 may serve as a negative fixed charge layer. In an implementation, the insulating liner 132 may include an insulating material, e.g., silicon oxide, silicon nitride, silicon oxynitride, or the like.

The buried conductive layer 134 may include polysilicon that contains a fining element at a first concentration. The fining element may include, e.g., oxygen, carbon, or fluorine. As used herein, the term "or" is not an exclusive term, e.g., the fining element may include one or more of the enumerated elements. In an implementation, the buried conductive layer 134 may include polysilicon containing oxygen at a concentration of about 5 at % (atomic percent) to about 40 at %. In an implementation, the buried conductive layer 134 may include polysilicon containing oxygen at a concentration of about 20 at % to about 30 at %. In an implementation, the buried conductive layer 134 may include polysilicon containing carbon at a concentration of about 1 at % to about 20 at %. In an implementation, the buried conductive layer 134 may include polysilicon containing fluorine at a concentration of about 1 at % to about 20 at %. In an implementation, the buried conductive layer 134 may include a plurality of grains made of silicon and having a silicon crystal structure, and the fining element may be uniformly dispersed within the grains of silicon. For example, the buried conductive layer 134 may have a diffraction peak at about 28.44° represented by a silicon (111) crystal plane in an X-ray diffraction analysis.

The buried conductive layer 134 may include a polysilicon containing the fining element at the first concentration, and the buried conductive layer 134 may have a relatively small grain size. In an implementation, the buried conductive layer 134 may have an average grain size of about 30 nanometers (nm) or less. In an implementation, in the buried conductive layer 134, a full width at half maximum of an X-ray diffraction peak (the peak being observed at a scattering angle of about) 28.44° by the silicon (111) crystal plane observed in the X-ray diffraction analysis may be about 0.4° to about 1.1° (See FIG. 15). In an implementation, the average grain size of the buried conductive layer 134 calculated from the X-ray diffraction peak may be about 7.5 nm to about 20.5 nm.

In an implementation, the pixel trench 130T may have a first width w11 at the same level as the first surface 110F1 of the semiconductor substrate 110 and a second width w12 (that is smaller than the first width w11) at the same level as the second surface 110F2 of the semiconductor substrate 110. For example, the first width w11 of the pixel trench 130T measured (e.g., in the first or X direction) at the first surface 110F1 of the semiconductor substrate 110 may be greater than the second width w12 of the pixel trench 130T measured at the second surface 110F2 of the semiconductor substrate 110. In an implementation, the pixel trench 130T may have a first height h11 in a direction (e.g., Z direction)

perpendicular to the first surface 110F1 of the semiconductor substrate 110, and a ratio of the first height h11 to the first width w11 may be about 20 to about 100.

In an implementation, voids or seams may not be formed within the buried conductive layer 134. The pixel trench 130T may have a relatively high aspect ratio (e.g., an aspect ratio of about 20 to 100), and seams could otherwise be formed in the conductive layer 134 in the process of forming the buried conductive layer 134 using polysilicon inside the pixel trench 130T, and undesired voids could be formed in the buried conductive layer 134 due to grain growth or grain coalescence in the buried conductive layer 134 in a subsequent heat treatment processes. However, according to the example embodiments, the buried conductive layer 134 may include the polysilicon containing the fining element (e.g., oxygen, carbon, or fluorine), and the buried conductive layer 134 may be formed to have a relatively small grain size in the process of forming the buried conductive layer 134 filling an interior of the pixel trench 130T. In addition, in a heat treatment process after the formation of the buried conductive layer 134, the fining element may be able to help restrain grain growth or grain coalescence, which could otherwise occur due to the migration of silicon atoms, thereby voids or seams not being formed in the buried conductive layer 134. The grain size and microstructure of the buried conductive layer 134 will be described again in detail below with reference to FIG. 15.

The buried conductive layer 134 may not fill a portion of an interior of the pixel trench 130T and a bottom surface of the buried conductive layer 134 may be at a level higher than the first surface 110F1 of the semiconductor substrate 110 (e.g., the bottom surface of the buried conductive layer 134 may be inwardly spaced apart from the first surface 110F1 of the semiconductor substrate 110 by a predetermined distance along the vertical direction (Z direction)). A buried insulating layer 140 may fill a remaining portion of the pixel trench 130T on the bottom surface of the buried conductive layer 134 and the insulating liner 132 may be between the buried insulating layer 140 and an inner wall of the pixel trench 130T. In an implementation, an upper, lower, or outer surface of the buried insulating layer 140 may be at the same level as (e.g., coplanar with) the first surface 110F1 of the semiconductor substrate 110. In an implementation, the buried insulating layer 140 may be omitted and the buried conductive layer 134 may be filled in an inside of the pixel trench 130T through the entire height h1 of the pixel trench 130T, such that the bottom or lower surface of the buried conductive layer 134 may be at the same level as (e.g., coplanar with) the first surface 110F1 of the semiconductor substrate 110.

In an implementation, as shown in FIG. 2, an isolation film STI (which defines an active region) and a floating diffusion region FD may be on the first surface 110F1 of the semiconductor substrate 110.

Gate electrodes TG, RG, SG (see FIG. 3) constituting a part of a plurality of transistors may be on the first surface 110F1 of the semiconductor substrate 110. In an implementation, the plurality of transistors may include a transmission transistor TX configured to transmit the charge generated in the photoelectric conversion region 120 to the floating diffusion region FD, a reset transistor RX configured to periodically reset the charge stored in the floating diffusion region FD, a drive transistor DX configured to function as a source follower buffer amplifier and to buffer a signal according to the charge charged in the floating diffusion region, and a selection transistor SX for switching and addressing in relation to selecting the active pixel region APR.

In an implementation, as illustrated in FIG. 2, the transmission gate TG constituting the transmission transistor TX may be a recess gate type extending from the first surface 110F1 of the semiconductor substrate 110 into the semiconductor substrate 110. In an implementation, a transmission gate insulating layer TGI may be between the semiconductor substrate 110 and the transmission gate TG. For example, as the transmission gate TG is formed in the recess gate type, a portion of the transmission gate insulating layer TGI may extend into the interior of the semiconductor substrate 110.

A first interconnection structure 152 may be on the first surface 110F1 of the semiconductor substrate 110. The first interconnection structure 152 may be electrically connected to the gate electrodes or the active region. The first interconnection structure 152 may be formed as a stacked structure of a plurality of layers. The first interconnection structure 152 may include at least one of impurity-doped or undoped polysilicon, metal, metal silicide, metal nitride, or metal-containing film. For example, the first interconnection structure 152 may include tungsten, aluminum, copper, tungsten silicide, titanium silicide, tungsten nitride, titanium nitride, doped polysilicon, and the like.

A first interlayer insulating film 154 may cover the first interconnection structure 152 on the first surface 110F1 of the semiconductor substrate 110. The first interlayer insulating film 154 may include an insulating material such as silicon oxide, silicon nitride, silicon oxynitride, or the like.

A rear insulating layer 160 may be arranged on the second surface 110F2 of the semiconductor substrate 110. The rear insulating layer 160 may be arranged on substantially the entire area of the second surface 110F2 of the semiconductor substrate 110, and the rear insulating layer 160 may contact an upper surface of the pixel isolation film 130 at the same level as the second surface 110F2 of the semiconductor substrate 110. In an implementation, the rear insulating layer 160 may include a metal oxide such as hafnium oxide, aluminum oxide, tantalum oxide, or the like. In an implementation, the rear insulating layer 160 may include an insulating material such as silicon oxide, silicon nitride, silicon oxynitride, or a low dielectric constant material, or the like.

A guide pattern 162 may be on the rear insulating layer 160. In a plan view, the guide pattern 162 may have a grid shape or a mesh shape. The guide pattern 162 may help prevent incident light with a tilt angle with respect to one photoelectric conversion region 120, from entering the photoelectric conversion region 120. The guide pattern 162 may include at least one metallic material, e.g., tungsten, aluminum, titanium, ruthenium, cobalt, nickel, copper, gold, silver or platinum.

A passivation layer 164 may cover the rear insulating layer 160 and the guide pattern 162 on the second surface 110F2 of the semiconductor substrate 110. A color filter 166 and a microlens 168 may be on the passivation layer 164.

In an implementation, a supporting substrate 170 may be on the first surface 110F1 of the semiconductor substrate 110. An adhesive member may be further arranged between the supporting substrate 170 and the first interlayer insulating film 154.

In the process of forming the buried conductive layer 134 using polysilicon inside the pixel trench 130T having a relatively high aspect ratio, it is possible that a seam could be formed in the buried conductive layer 134, and in a subsequent heat treatment process grain growth or grain coalescence could occur to form an undesired void in the buried conductive layer 134. If such a void were to be formed, performance of the image sensor 100 may be lowered, due to an occurrence of a dark current or an increase in noise level, or the like.

On the other hand, in the image sensor 100 according to an embodiment, the buried conductive layer 134 may include polysilicon containing the fining element (e.g., oxygen, carbon, or fluorine), and the buried conductive layer 134 may be formed to have a relatively small grain size. In addition, the fining element may help prevent grain growth or grain coalescence in the heat treatment process after the formation of the buried conductive layer 134, and the formation of undesired voids may be prevented. For example, voids or seams may not be formed in the buried conductive layer 134, and the image sensor 100 may be prevented from generating a dark current or increasing of noise level to have improved performance.

Figure 15:
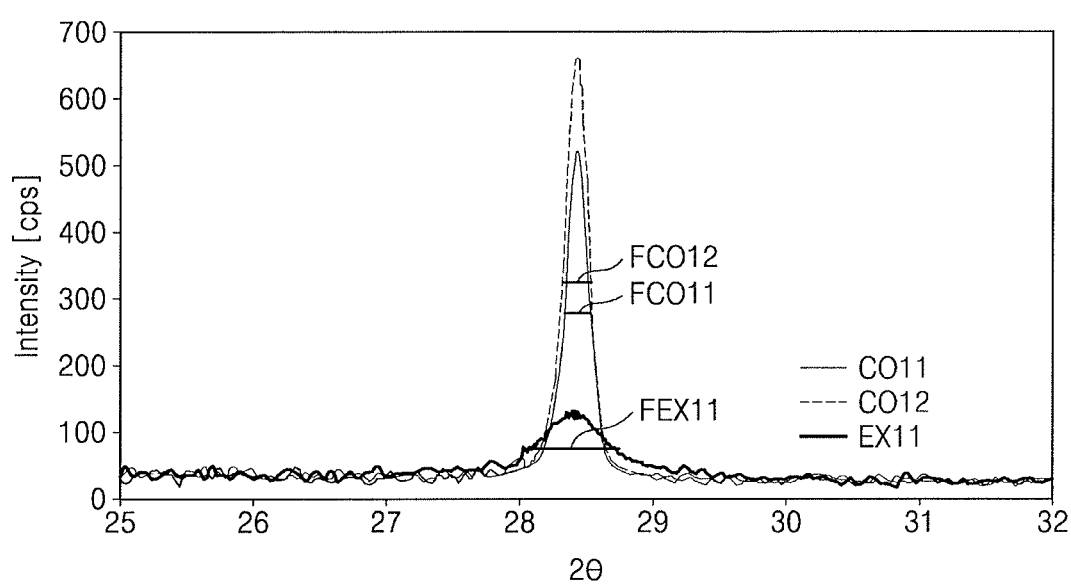
FIG. 15 illustrates an X-ray diffraction analysis graph of a buried conductive layer included in an image sensor according to an Example and Comparative Examples.

FIG. 15 illustrates an X-ray diffraction analysis graph of the buried conductive layer included in the image sensors according to an Example and Comparative Examples.

The following Example and Comparative Examples are provided in order to highlight characteristics of one or more embodiments, but it will be understood that the Example and Comparative Examples are not to be construed as limiting the scope of the embodiments, nor are the Comparative Examples to be construed as being outside the scope of the embodiments. Further, it will be understood that the embodiments are not limited to the particular details described in the Example and Comparative Examples.

Referring to FIG. 15, a buried conductive layer EX11 according to an Example was formed using polysilicon containing oxygen as the fining element at a first concentration, as described with reference to FIGS. 1 and 2, and then a subsequent heat treatment was performed. Buried conductive layers CO11 and CO12 according to Comparative Examples 1 and 2, respectively, were formed using polysilicon without the fining element, and then a subsequent heat treatment was performed.

Referring to FIG. 15 and the following Table 1, in the buried conductive layer EX11 according to the Example and the buried conductive layers CO11 and CO12 according to the Comparative Examples, diffraction peaks by silicon (111) crystal planes are observed at a scattering angle of about 28.44°, and the intensity of the diffraction peak of the buried conductive layer EX11 according to the Example was lower than the intensity of the diffraction peaks of the buried conductive layers CO11 and CO12 according to the Comparative Examples.

In addition, a full width at half maximum (FEX11) by the silicon (111) crystal plane of the buried conductive layer EX11 according to the Example was higher than a full width at half maximum FCO11 of the buried conductive layer CO11 according to Comparative Example 1 and a full width at half maximum FCO12 of the buried conductive layer CO12 according to Comparative Example 2. From the calculation based on the full widths at half maximum of such X-ray diffraction peaks, the buried conductive layer EX11 according to the Example may have an average grain size of about 16.8 nm, while the buried conductive layer CO11 according to the Comparative Example 1 may have an average grain size of about 43.5 nm, and the buried conductive layer CO12 according to the Comparative Example 2 may have an average grain size of about 45.8 nm.

TABLE 1

| | Intensity of (111) plane diffraction peak | Full width at half maximum |
|---|---|---|
| Comparative Example 1 (CO11) | 481 | 0.19 |
| Comparative Example 2 (CO12) | 611 | 0.18 |
| Example (EX11) | 79 | 0.49 |

Voids or seams were observed inside the buried conductive layers CO11 and CO12 according to the Comparative Examples, while voids or seams were not observed inside the buried conductive layer EX11 according to the Example.

According to an embodiment, the buried conductive layer 134 (see FIG. 2) may have a relatively small grain size by including the fining element (including at least one of oxygen, carbon, and fluorine), and then the formation of undesired voids in a subsequent heat treatment process may be prevented by the fining element.

Figure 3:
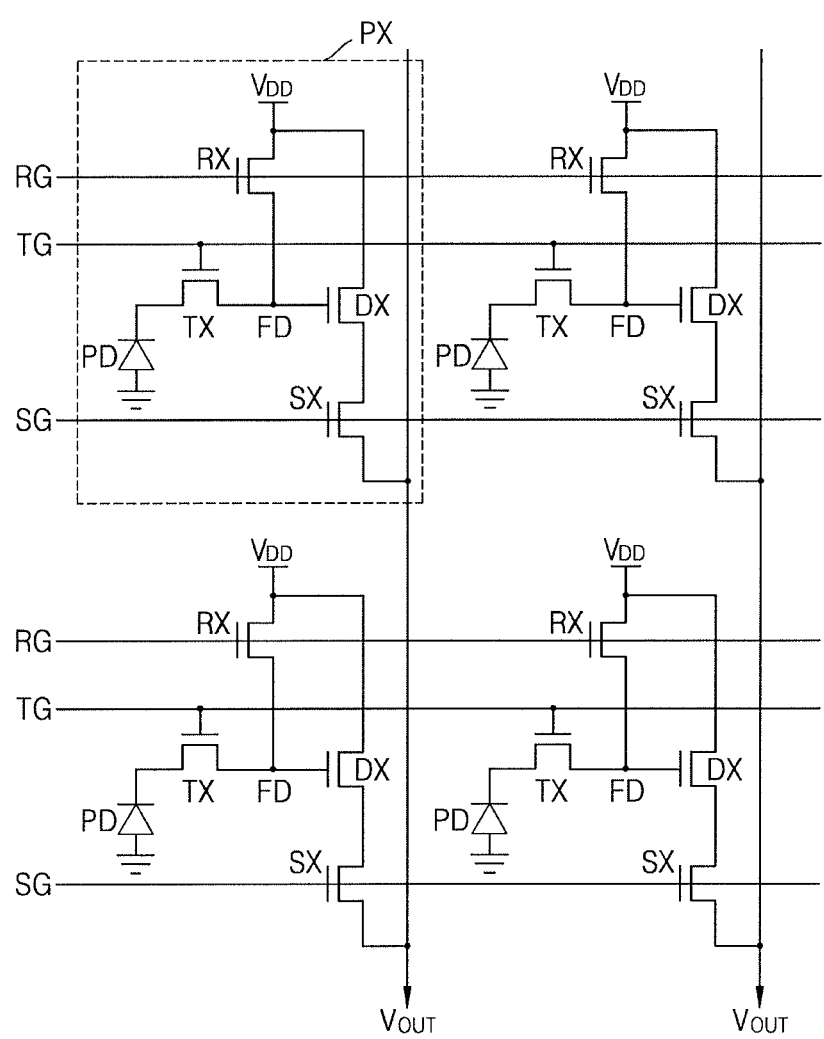
FIG. 3 illustrates an equivalent circuit diagram of an active pixel of an image sensor according to example embodiments.

FIG. 3 illustrates an equivalent circuit diagram of the active pixel PX of the image sensor 100 of FIGS. 1 and 2 according to example embodiments.

Referring to FIG. 3, the plurality of active pixels PX may be arranged in a matrix form. Each of the plurality of active pixels PX may include a transmission transistor TX and logic transistors RX, SX, DX. Herein, the logic transistors may include a reset transistor RX, a selection transistor SX, and a drive transistor DX (or a source follower transistor). The reset transistor RX may include a reset gate RG and the selection transistor SX may include a selection gate SG and the transfer transistor TX may include a transmission gate TG.

Each of the plurality of active pixels PX may further include a photoelectric conversion device PD and a floating diffusion region FD. The photoelectric conversion device PD may correspond to the photoelectric conversion region 120 described with reference to FIGS. 1 and 2. The photoelectric conversion device PD may generate and accumulate photo charges in proportion to the amount of incident light from an outside, and a photodiode, a photo transistor, a photo gate, a pinned photodiode PPD and combinations thereof may be used as the photoelectric conversion device PD.

The transmission gate TG may transfer the charges generated in the photoelectric conversion device PD to the floating diffusion region FD. The floating diffusion region FD may receive the charges generated in the photoelectric conversion device PD and accumulate the charges. The drive transistor DX may be controlled according to the amount of the photo charges accumulated in the floating diffusion region FD.

The reset transistor RX may periodically reset the charges accumulated in the floating diffusion region FD. A drain electrode of the reset transistor RX is connected to the floating diffusion region FD and a source electrode thereof is connected to a power source voltage VDD. When the reset transistor RX is turned on, the power source voltage VDD connected to the source electrode of the reset transistor RX is transferred to the floating diffusion region FD. When the reset transistor RX is turned on, the charges accumulated in the floating diffusion region FD are discharged to reset the floating diffusion region FD.

The drive transistor DX is connected to a current source (not shown) located outside the plurality of active pixels PX and then functions as a source follower buffer amplifier, and it amplifies potential change in the floating diffusion region FD and outputs it to the output line VOUT.

The selection transistor SX may select the plurality of active pixels PX row by row and when the selection transistor SX is turned on, the power supply voltage VDD may be transferred to a source electrode of the drive transistor DX.

Figure 4:
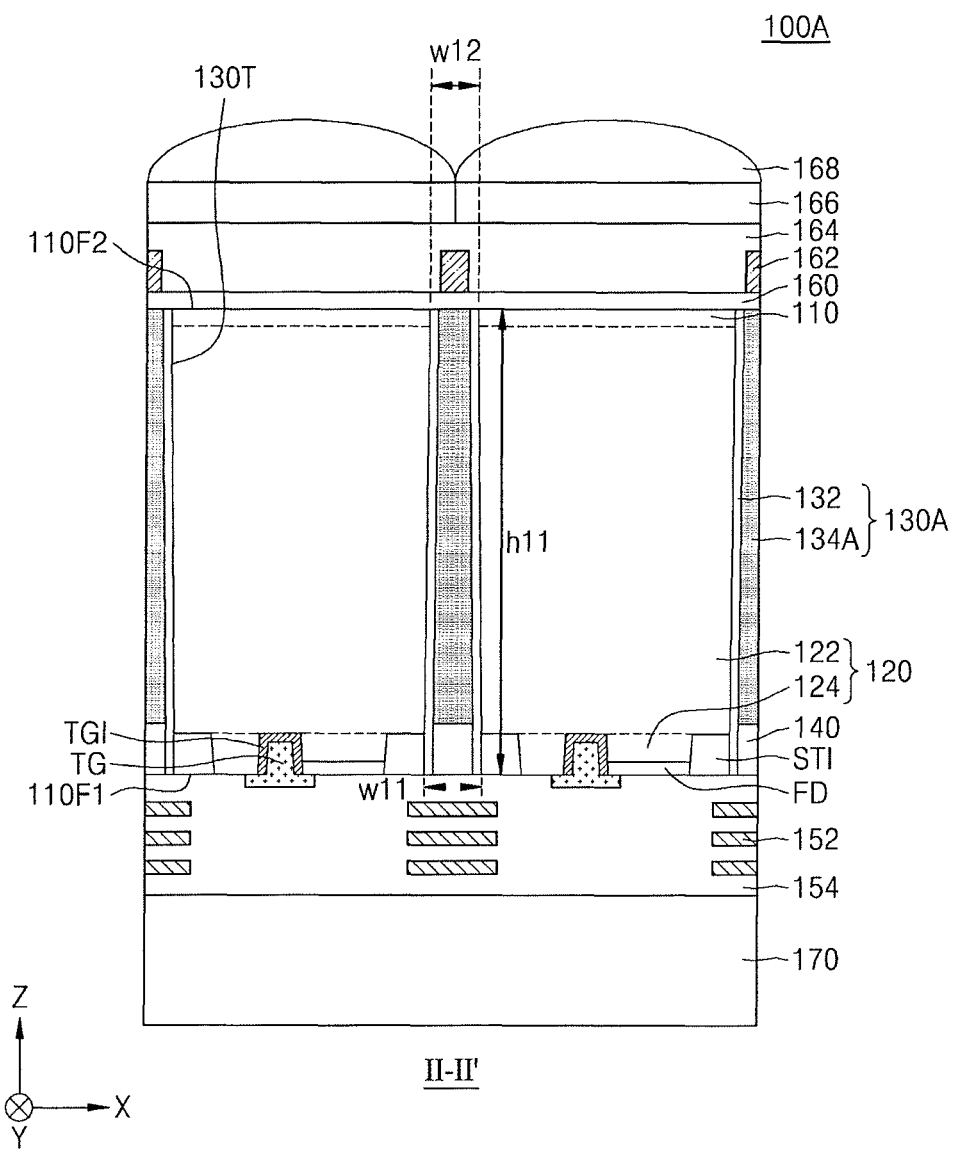
FIG. 4 illustrates a cross-sectional view of an image sensor according to example embodiments.

FIG. 4 illustrates a cross-sectional view of an image sensor 100A according to example embodiments. FIG. 4 is a cross-sectional view of a portion corresponding to the portion II-II' of FIG. 1. In FIG. 4, the same reference numerals as in FIGS. 1 to 3 denote the same elements.

Referring to FIG. 4, the pixel isolation layer 130A may include an insulating liner 132 and a buried conductive layer 134A. The buried conductive layer 134A may contain polysilicon containing the fining element at the first concentration and a P-type dopant at a second concentration or an N-type dopant at the second concentration. For example, the fining element may include oxygen, carbon, or fluorine. In an implementation, the P-type dopant may include, e.g., boron, aluminum, or indium. In an implementation, the N-type dopant may include, e.g., phosphorus, arsenic, or antimony. The fining element may function as an additive, with which the buried conductive layer 134A may be formed to have a fine grain size, and the P type dopant or the N type dopant may help increase the conductivity of the buried conductive layer 134A.

In an implementation, the fining elements may be uniformly dispersed in the buried conductive layer 134A, and the P-type dopant or the N-type dopant may also be uniformly dispersed in the buried conductive layer 134A.

In the manufacturing process of the image sensor 100A according to an embodiment, a first conductive layer 134A1 (see FIG. 9A) may be formed by using polysilicon containing the P-type dopant or the N-type dopant on an inner wall of the pixel trench 130T, a second conductive layer 134B1 (see FIG. 9B) may be formed on the first conductive layer 134A1 by using the polysilicon containing the fining element, and the buried conductive layer 134A may be formed by performing a heat treatment process and then diffusing the fining element in the first conductive layer 134A1 and the P-type or the N-type dopant in the second conductive layer 134B1.

Figure 5:
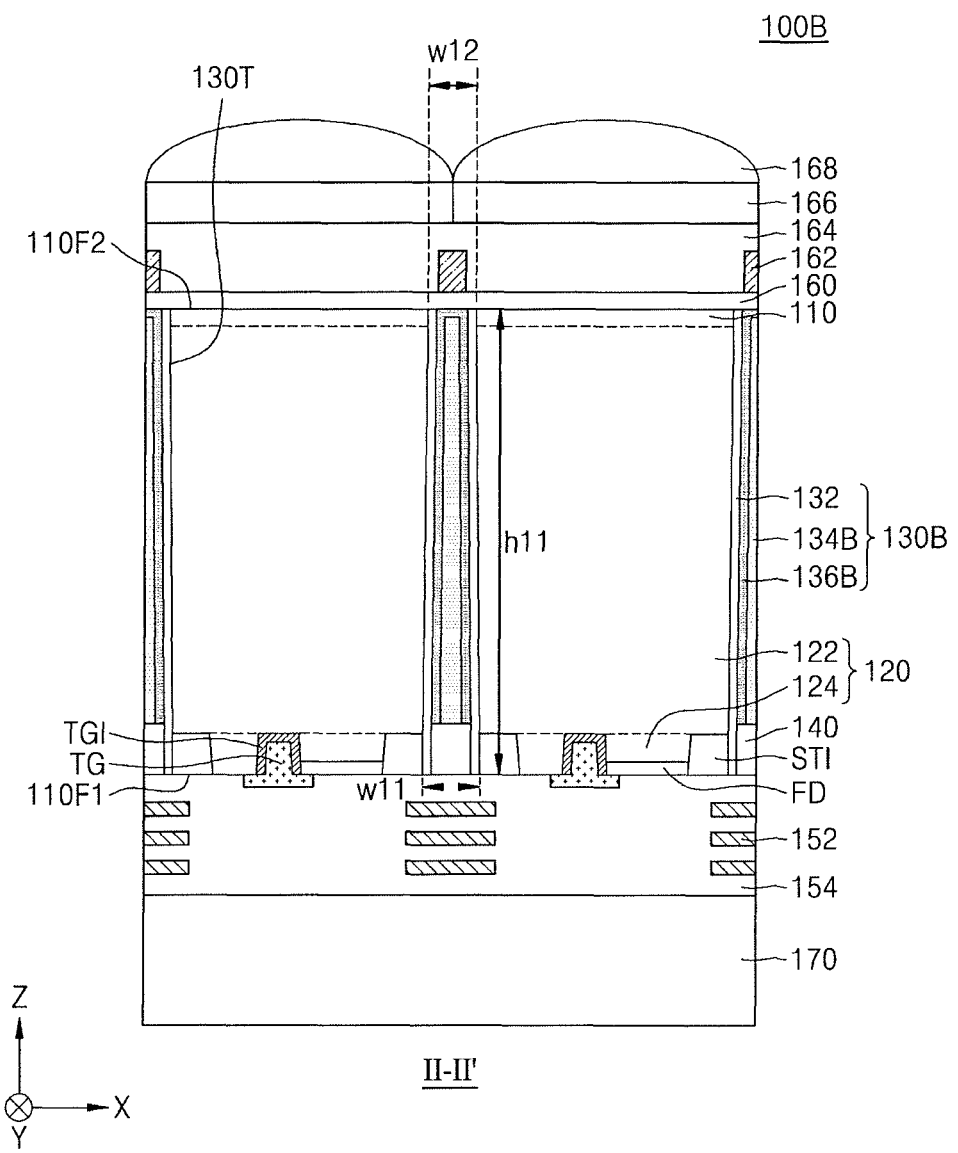
FIG. 5 illustrates a cross-sectional view of an image sensor according to example embodiments.

FIG. 5 illustrates a cross-sectional view of an image sensor 100B according to example embodiments. FIG. 5 is a cross-sectional view taken along line II-II' of FIG. 1. In FIG. 5, the same reference numerals as in FIGS. 1 to 4 denote the same elements.

Referring t FIG. 5, a pixel isolation film 130B may include an insulating liner 132, a buried conductive layer 134B, and an interface layer 136B. The buried conductive layer 134B may include polysilicon containing the fining element at a first concentration, and the fining element may include at least one of oxygen, carbon, and fluorine.

The interface layer 136B may be between the insulating liner 132 and the buried conductive layer 134B. The interface layer 136B may include polysilicon containing the P-type dopant or the N-type dopant.

In an implementation, the interface layer 136B may be between the rear insulating layer 160 and the buried conductive layer 134B at the same level as the second surface 110F2 of the semiconductor substrate 110, so that the buried conductive layer 134B may not contact the rear insulating layer 160. In an implementation, the interface layer 136B may surround the sidewall of the buried conductive layer 134B on the sidewall of the pixel trench 130T, so that both the buried conductive layer 134B and the interface layer 136B may be in contact with the rear insulating layer 160 at the same level as the second surface 110F2 of the semiconductor substrate 110.

In the manufacturing process of the image sensor 100B according to the example embodiments, the first conductive layer 134A1 (see FIG. 9A) may formed on the inner wall of the pixel trench 130T by using polysilicon containing the P-type dopant or the N-type dopant, and then a second conductive layer 134B1 (see FIG. 9B) may be formed on the first conductive layer 134A1 by using polysilicon containing the fining element. Herein, a part of the first conductive layer 134A1 may correspond to the interface layer 136B and a part of the second conductive layer 134B1 may correspond to the buried conductive layer 134B, respectively.

Figure 6:
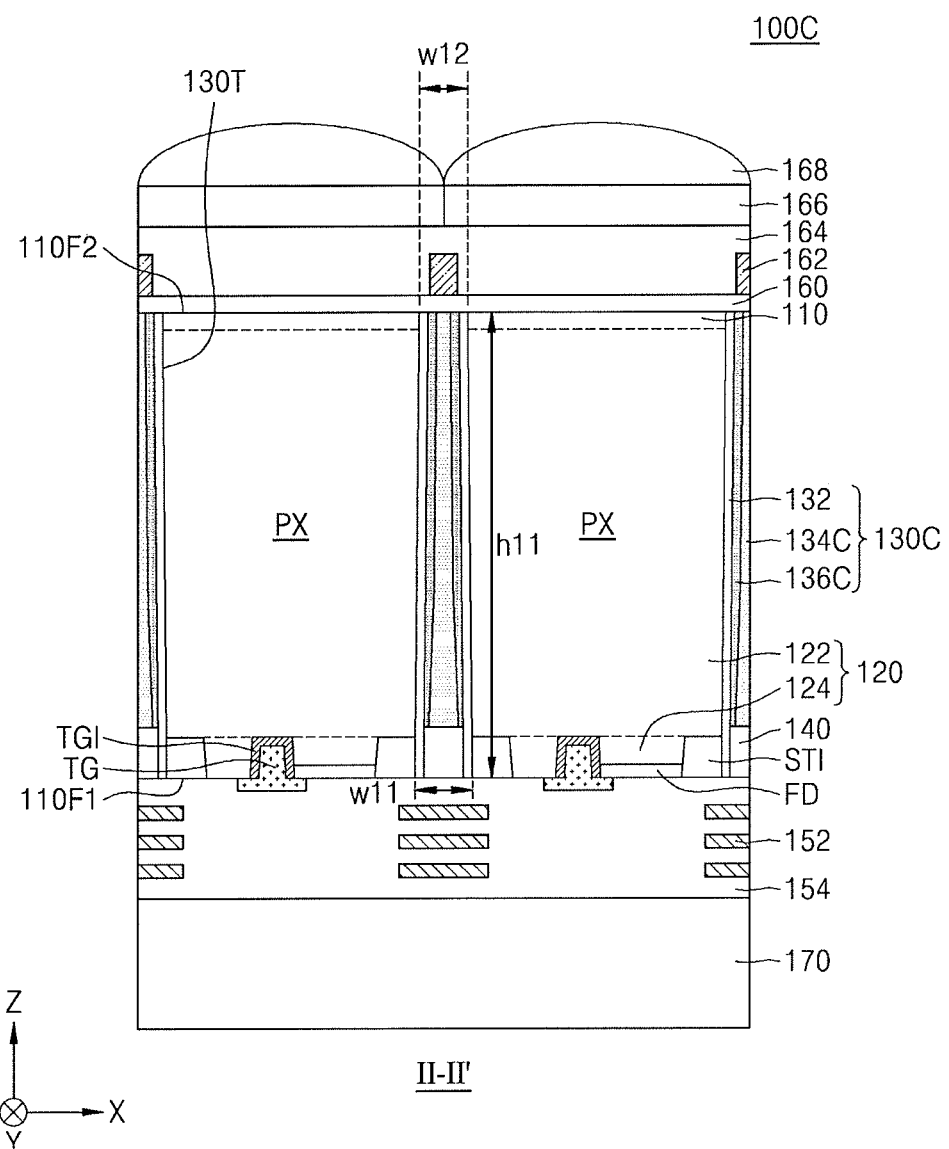
FIG. 6 illustrates a cross-sectional view of an image sensor according to example embodiments.

FIG. 6 illustrates a cross-sectional view of an image sensor 100C according to example embodiments. FIG. 6 is a cross-sectional view of a portion corresponding to the portion II-II' of FIG. 1. In FIG. 6, the same reference numerals as in FIGS. 1 to 5 denote the same elements.

Referring to FIG. 6, a pixel isolation film 130C may include an insulating liner 132, a buried conductive layer 134C, and an interface layer 136C. The buried conductive layer 134C may include polysilicon containing the fining element at a first concentration, and the fining element may include at least one of oxygen, carbon, and fluorine.

The interface layer 136C may be between the insulating liner 132 and the buried conductive layer 134C, and may have a tapered shape in a direction (e.g., Z direction) toward a first surface 110F1 of the semiconductor substrate 110. For example, a width of the interface layer 136C may become smaller in the Z direction from the second surface 110F2 to the first surface 110F1 of the semiconductor substrate 110. The interface layer 136C may include polysilicon containing a P-type dopant or an N-type dopant.

In the manufacturing process of the image sensor 100C according to the example embodiments, a first conductive layer 134A2 (see FIG. 12A) may be formed on an inner wall of the pixel trench 130T by using polysilicon containing the P-type dopant or the N-type dopant. And then, by performing anisotropic etching to the first conductive layer 134A2, a top portion 134A2T of the first conductive layer 134A2 (see FIG. 12B) may have the tapered shape while a top entrance of the pixel trench 130T may be expanded. Thereafter, a second conductive layer 134B2 (see FIG. 12C) may be formed on the first conductive layer 134A2 using polysilicon containing the fining element. Herein, a part of the first conductive layer 134A2 may correspond to the interface layer 136C and a part of the second conductive layer 134B2 may correspond to the buried conductive layer 134C, respectively.

FIGS. 7A-7L illustrate cross-sectional views of stages in a method of manufacturing the image sensor 100 in accordance with example embodiments. In FIGS. 7A-7L, cross-sectional views corresponding to the cross-sectional views taken along line II-II' of FIG. 1 are shown in the order of process. In FIGS. 7A-7L, the same reference numerals as in FIGS. 1-6 denote the same elements.

Figure 7A:
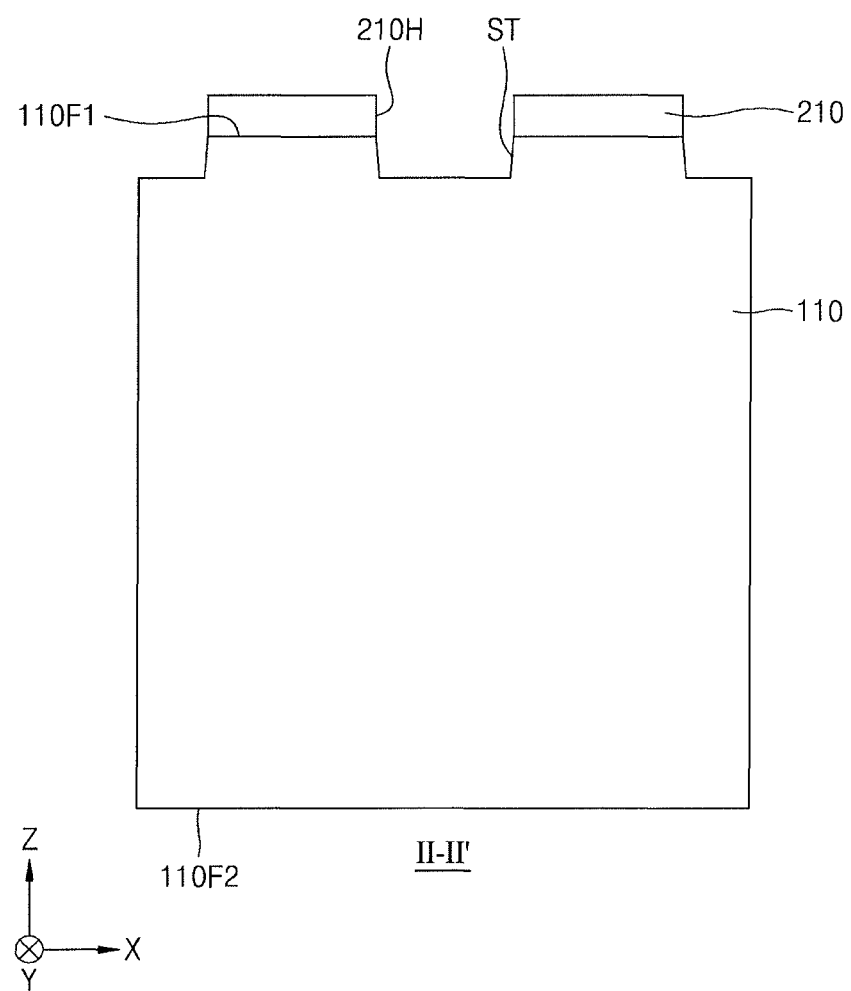
FIGS. 7A-7L illustrate cross-sectional views of stages in a method of manufacturing an image sensor according to example embodiments

Referring to FIG. 7A, the semiconductor substrate 110 having the first surface 110F1 and the second surface 110F2 opposite to each other is provided.

Thereafter, a first mask layer 210 having an opening 210H may be formed on the first surface 110F1 of the semiconductor substrate 110 and using the first mask layer 210, a part of the semiconductor substrate 110 may be removed from the first surface 110F1 to form an isolation trench ST.

Figure 7B:
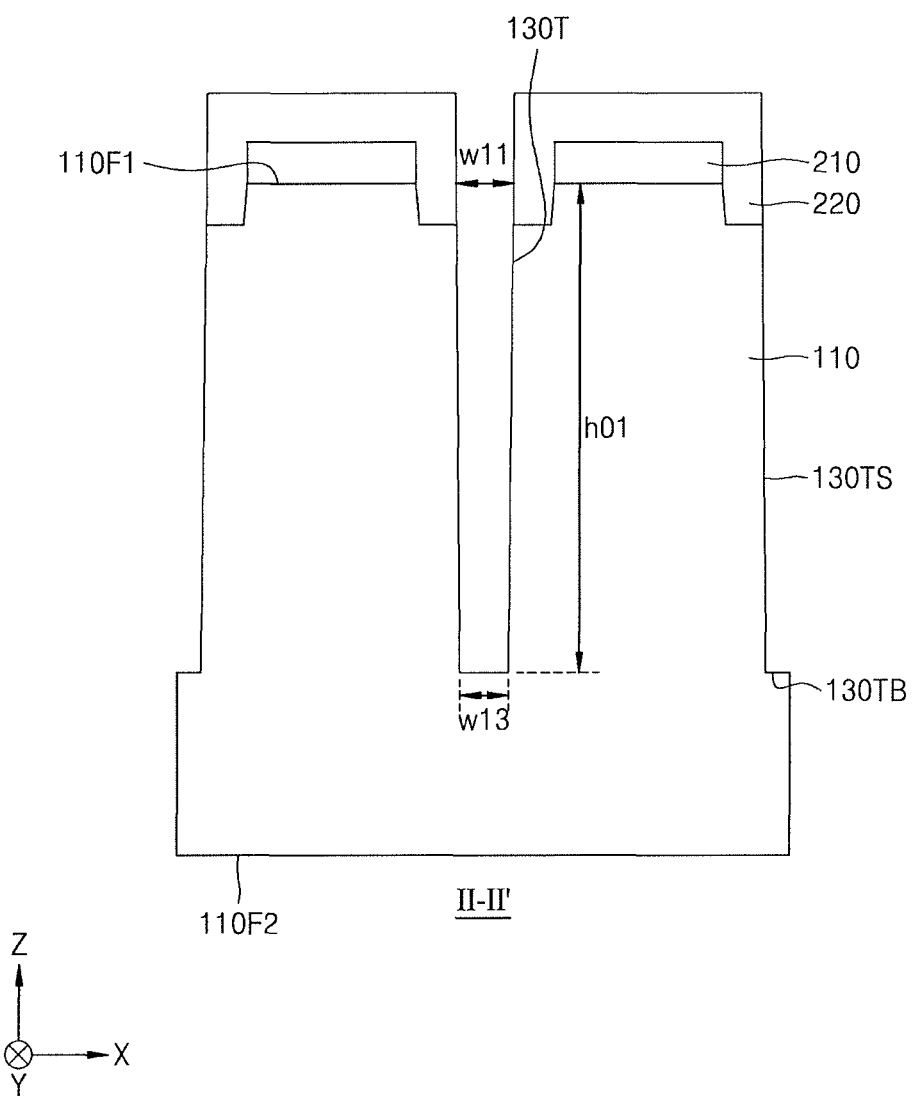

Referring to FIG. 7B, an isolation insulating layer 220 may be formed on the first surface 110F1 of the semiconductor substrate 110 and the first mask layer 210 to fill the isolation trench ST. The isolation insulating layer 220 may be formed using silicon oxide, silicon oxynitride, or silicon nitride.

Thereafter, a mask pattern may be formed on the isolation insulating layer 220, and the pixel trench 130T may be formed in the semiconductor substrate 110 using the mask pattern.

The pixel trench 130T may have a first height h01 from the first surface 110F1 of the semiconductor substrate 110 and may have a first width w11 along a first direction (an X direction) at the same level as the first surface 110F1 of the semiconductor substrate 110. In an implementation, the pixel trench 130T may have an aspect ratio of about 20 to about 100.

In an implementation, the pixel trench 130T may have a second width w13 (that is less than the first width w11 along the first direction (the X direction)) at a bottom portion 130TB of the pixel trench 130T. In this case, a sidewall 130TS of the pixel trench 130T may be slightly inclined so that the width of the pixel trench 130T becomes narrower from the top to the bottom of the pixel trench 130T.

Figure 7C:
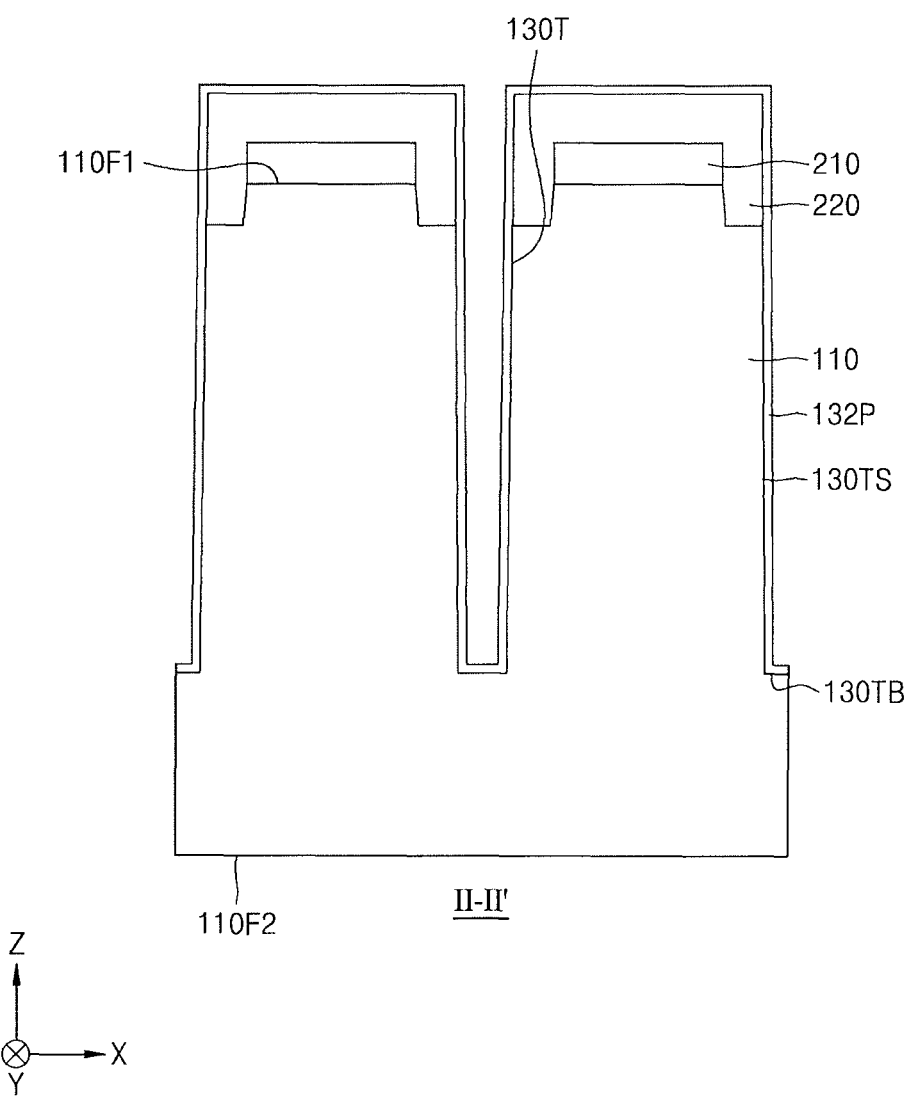

Referring to FIG. 7C, a preliminary insulating liner 132P may be conformally formed on the isolation insulating layer 220 and the inner wall of the pixel trench 130T by a chemical vapor deposition (CVD) process, or an atomic layer deposition (ALD) process. The preliminary insulating liner 132P may have substantially the same thickness on the sidewall 130TS and the bottom portion 130TB of the pixel trench 130T.

Figure 7D:
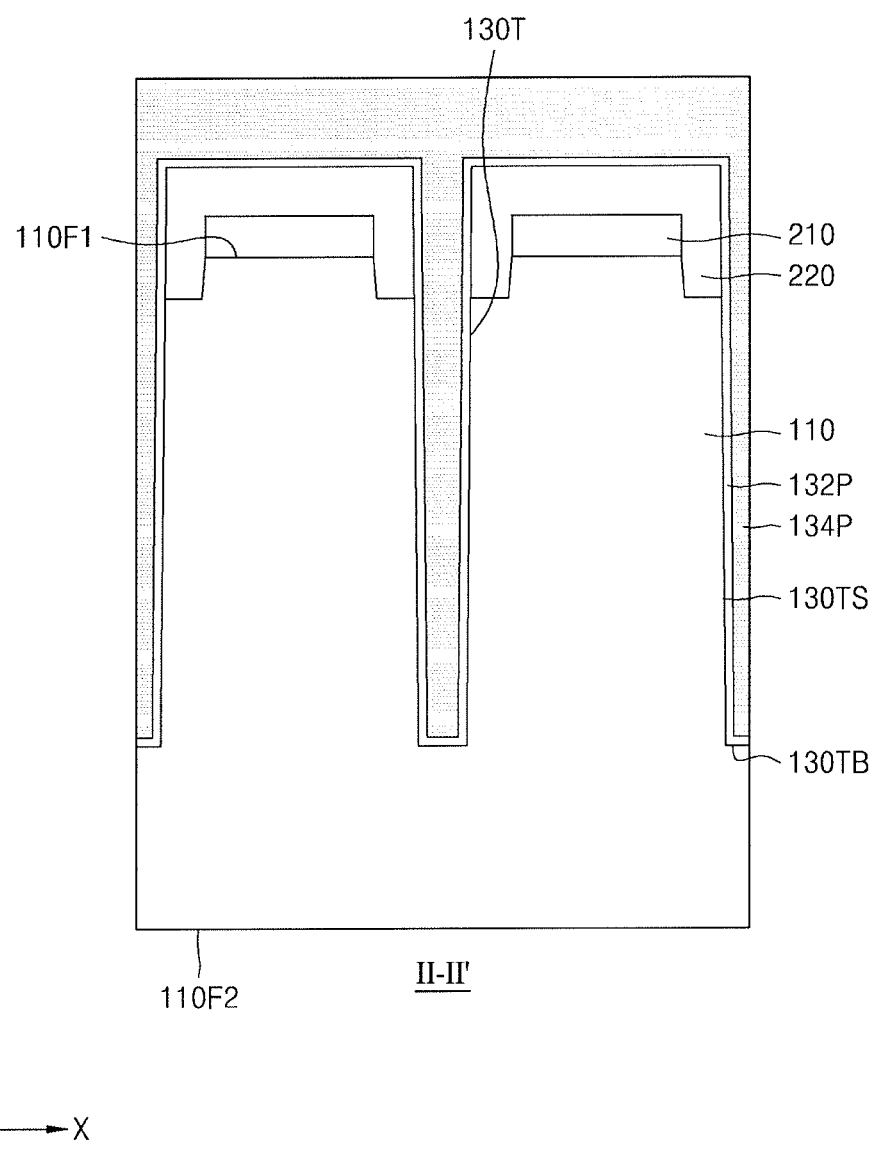

Referring to FIG. 7D, a conductive layer 134P filling the inner of the pixel trench 130T may be formed on the preliminary insulating liner 132P. The conductive layer 134P may include polysilicon containing the fining element at a first concentration.

In an implementation, the process of forming the conductive layer 134P may include the CVD process or the ALD process using a silicon source material and the fining element source material as precursors. In an implementation, when the fining element includes oxygen, the fining element source material may include, e.g., an oxidizing agent such as nitrogen oxide ($N_2O$) or nitrogen monoxide (NO). In an implementation, when the fining element includes carbon, the fining element source material may include, e.g., hydrocarbons such as methane ($CH_4$), ethylene ($C_2H_4$), acetylene ($C_2H_2$) or propane ($C_3H_8$). In an implementation, when the fining element includes fluorine, the fining element source material may include, e.g., a fluorine-containing precursor material such as nitrogen trifluororide ($NF_3$), silicon tetrafluoride ($SiF_4$), etc.

For example, the conductive layer 134P may be formed by reaction according to the following Formula 1 using a silicon source material and an oxygen source material.

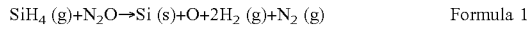

$$SiH_4\ (g) + N_2O \rightarrow Si\ (s) + O + 2H_2\ (g) + N_2\ (g) \qquad \text{Formula 1}$$

In an implementation, the conductive layer 134P may include polysilicon containing about 5 at % to 40 at % of oxygen. In an implementation, when the fining element includes carbon or fluorine, the conductive layer 134P may include polysilicon containing about 1 at % to 20 at % of carbon or polysilicon containing about 1 at % to 20 at % of fluorine.

The conductive layer 134P may be formed to include polysilicon containing the fining element at the first concentration, and the conductive layer 134P may have a relatively small grain size. For example, the conductive layer 134P may have polycrystalline microstructure having an average grain size of less than about 30 nm. In an implementation, voids or seams may not be formed within the conductive layer 134P in the pixel trench 134T having a relatively large aspect ratio.

Figure 7E:
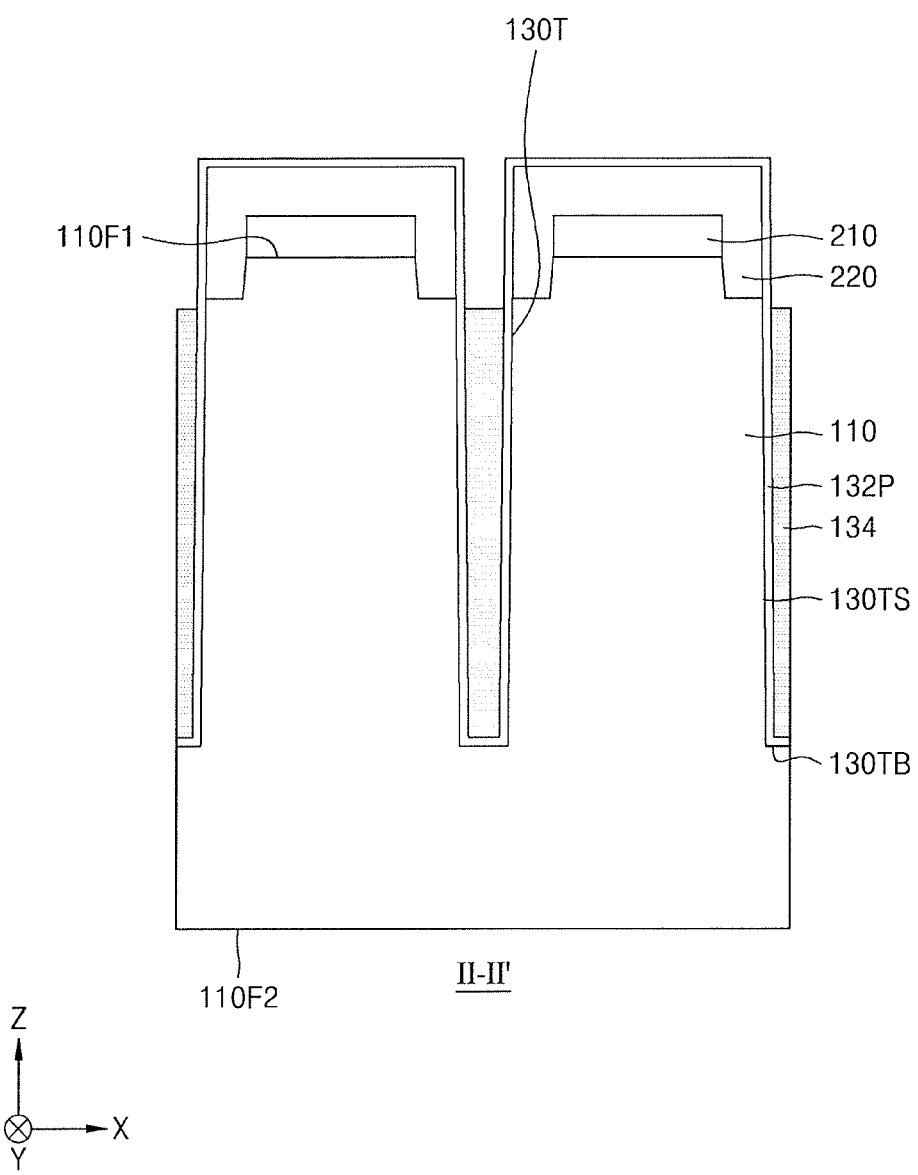

Referring to FIG. 7E, a portion of the conductive layer 134P (see FIG. 7D) on the preliminary insulating liner 132P outside the pixel trench 134T may be removed to remain the buried conductive layer 134 in the pixel trench 134T. In an implementation, as shown in FIG. 7E, the top surface of the buried conductive layer 134 may be at a lower level than the first surface 110F1 of the semiconductor substrate 110.

Figure 7F:
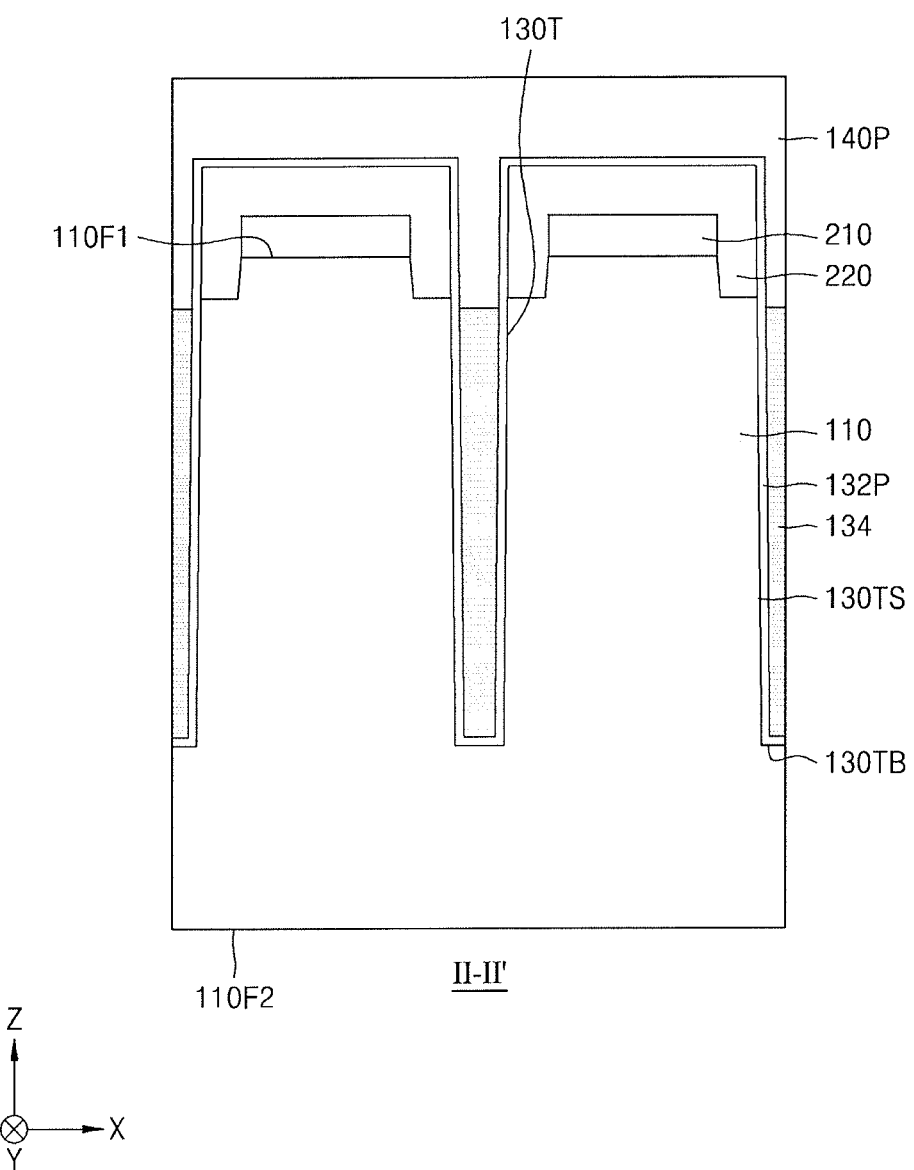

Referring to FIG. 7F, a preliminary buried insulating layer 140P may be formed on the buried conductive layer 134 and the preliminary insulating liner 132P using an insulating material. The preliminary buried insulating layer 140P may fill the remaining space of the pixel trench 130T.

Figure 7G:
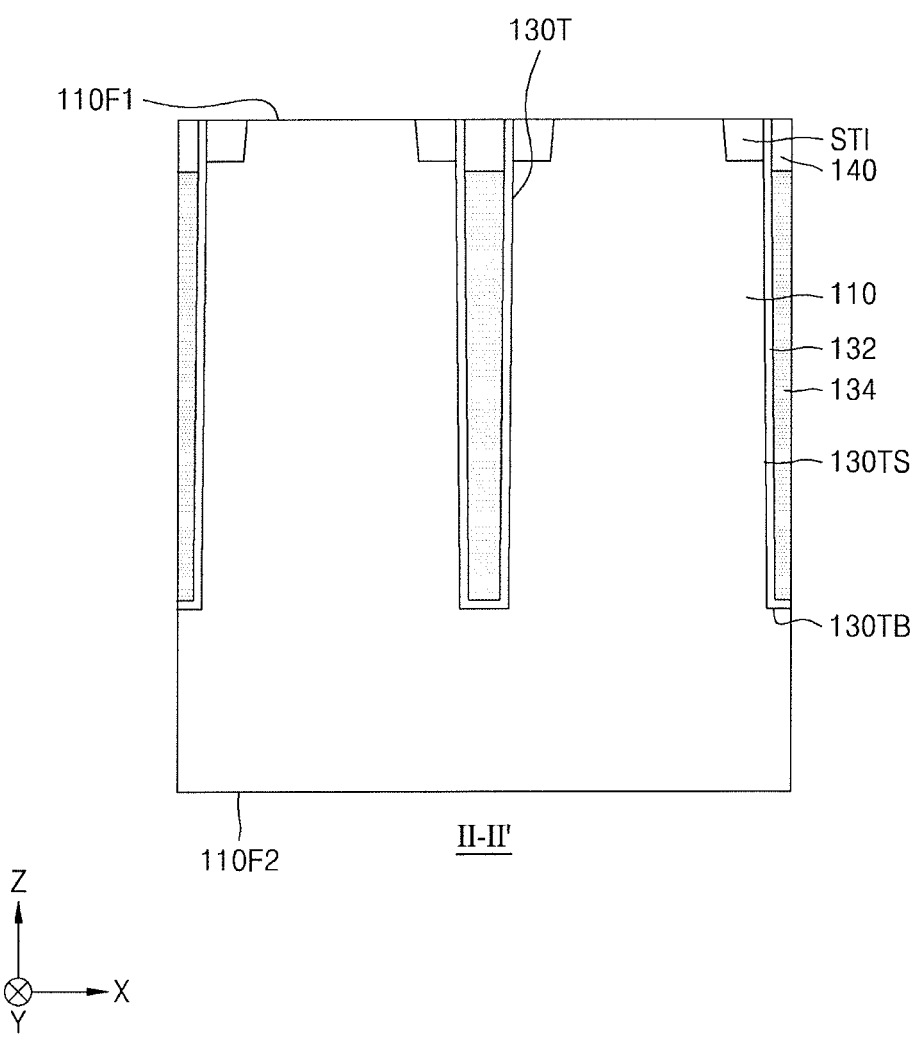

Referring to FIG. 7G, a portion of the preliminary buried insulating layer 140P (see FIG. 7F), a portion of the preliminary insulating liner 132P (see FIG. 7F), a portion of the isolation insulating layer 220 and the first mask layer 210 (see FIG. 7F) may be removed to expose the first surface 110F1 of the semiconductor substrate 110. A remaining portion of the preliminary buried insulating layer 140P may be the buried insulating layer 140, a remaining portion of the preliminary insulating liner 132P may be the insulating liner 132 and a remaining portion of the isolation insulating layer 220 may be the isolation film STI.

Figure 7H:
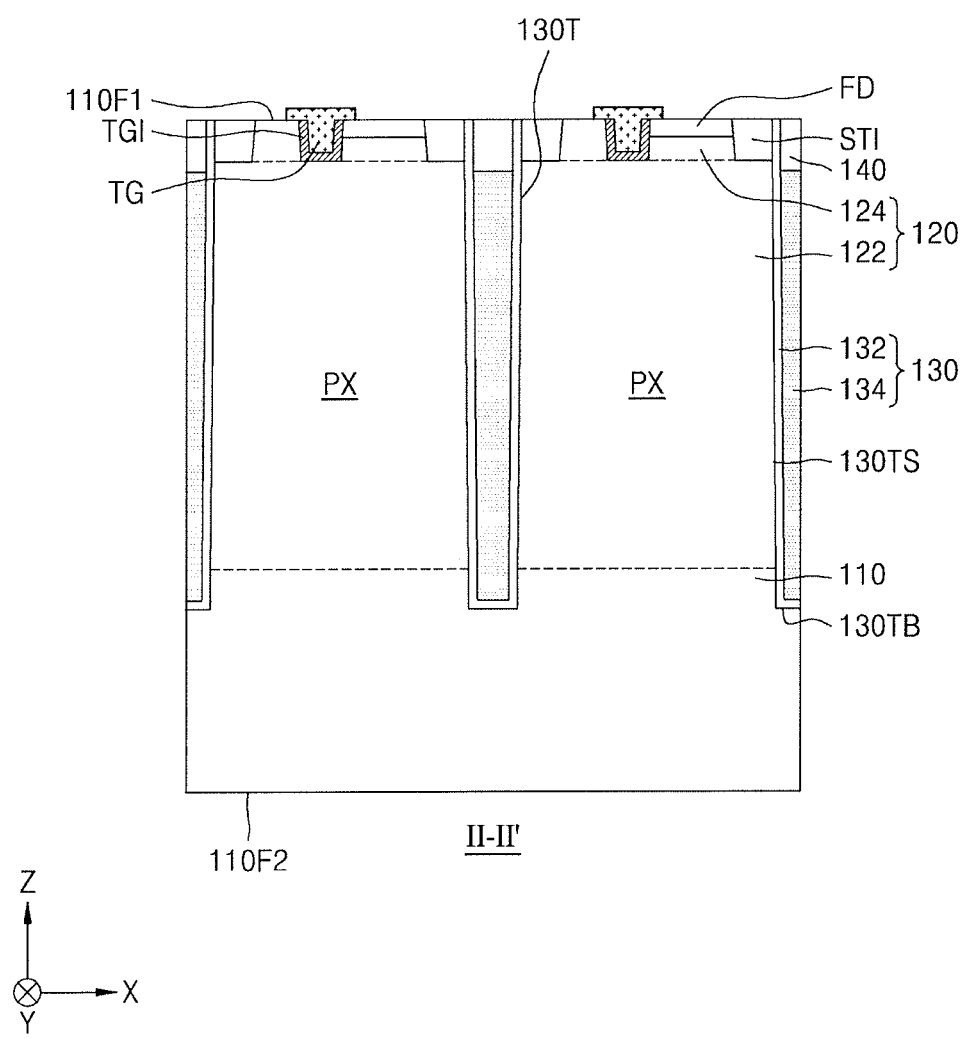

Referring to FIG. 7H, a photoelectric conversion region 120 including a photodiode region 122 and a well region 124 may be formed from or at the first surface 110F1 of the semiconductor substrate 110 by an ion implantation process. For example, the photodiode region 122 may be formed by doping with N-type impurities, and the well region 124 may be formed by doping with P-type impurities.

A gate structure including a transmission gate TG and a transmission gate insulating layer TGI may be formed on the first surface 110F1 of the semiconductor substrate 110 and then a floating diffusion region FD and an active region may be formed in a part of the first surface 110F1 of the semiconductor substrate 110 by the ion implantation process.

Figure 7I:
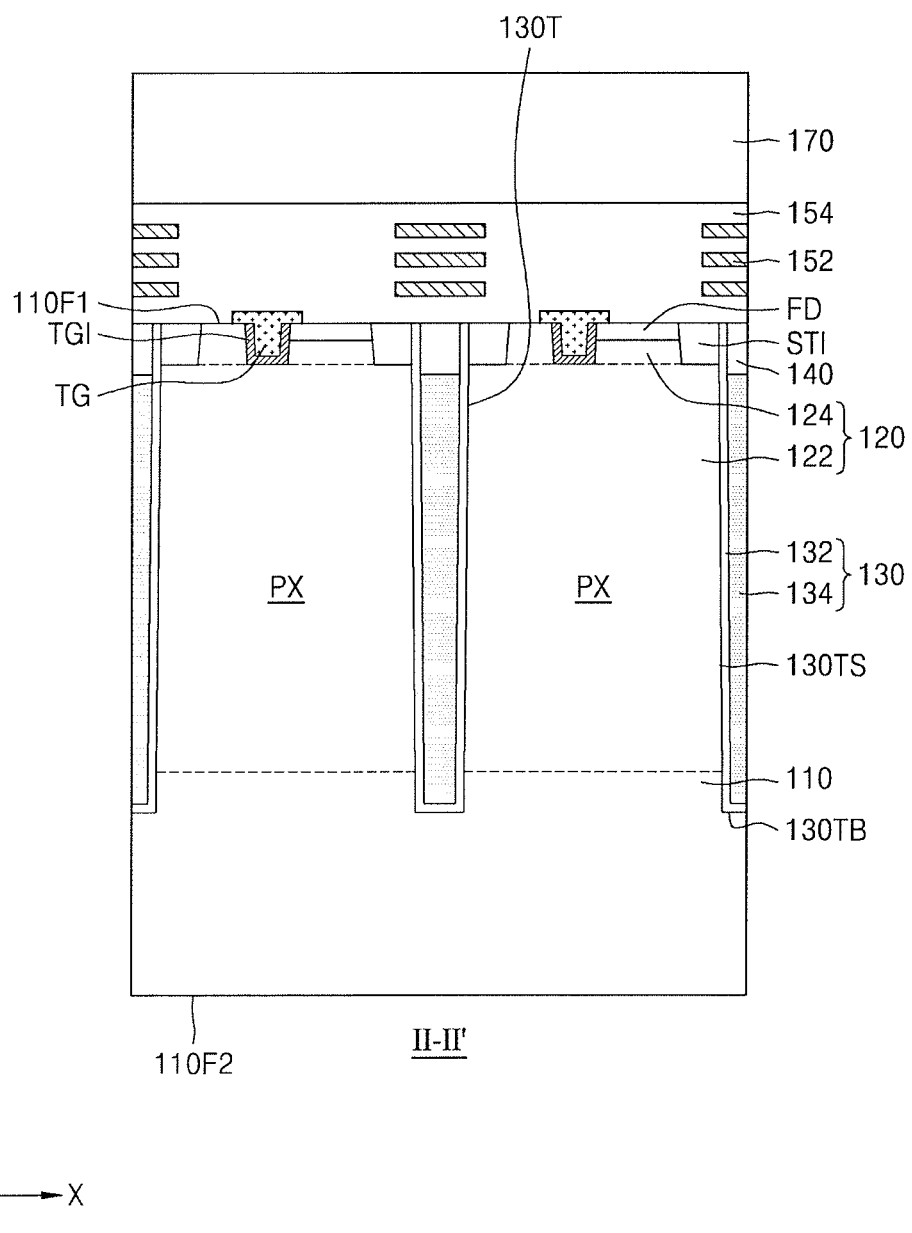

Referring to FIG. 7I, a first interconnection structure 152 and a first interlayer insulating film 154 covering the first interconnection structure 152 may be formed on the semiconductor substrate 110 by repeatedly performing the operations of forming a conductive layer on the first surface 110F1 of the semiconductor substrate 110, patterning the conductive layer, and forming an insulating layer covering the patterned conductive layer.

Thereafter, a supporting substrate 170 may be adhered to the first interlayer insulating film 154. An adhesive layer may be between the supporting substrate 170 and the first interlayer insulating film 154.

Figure 7J:
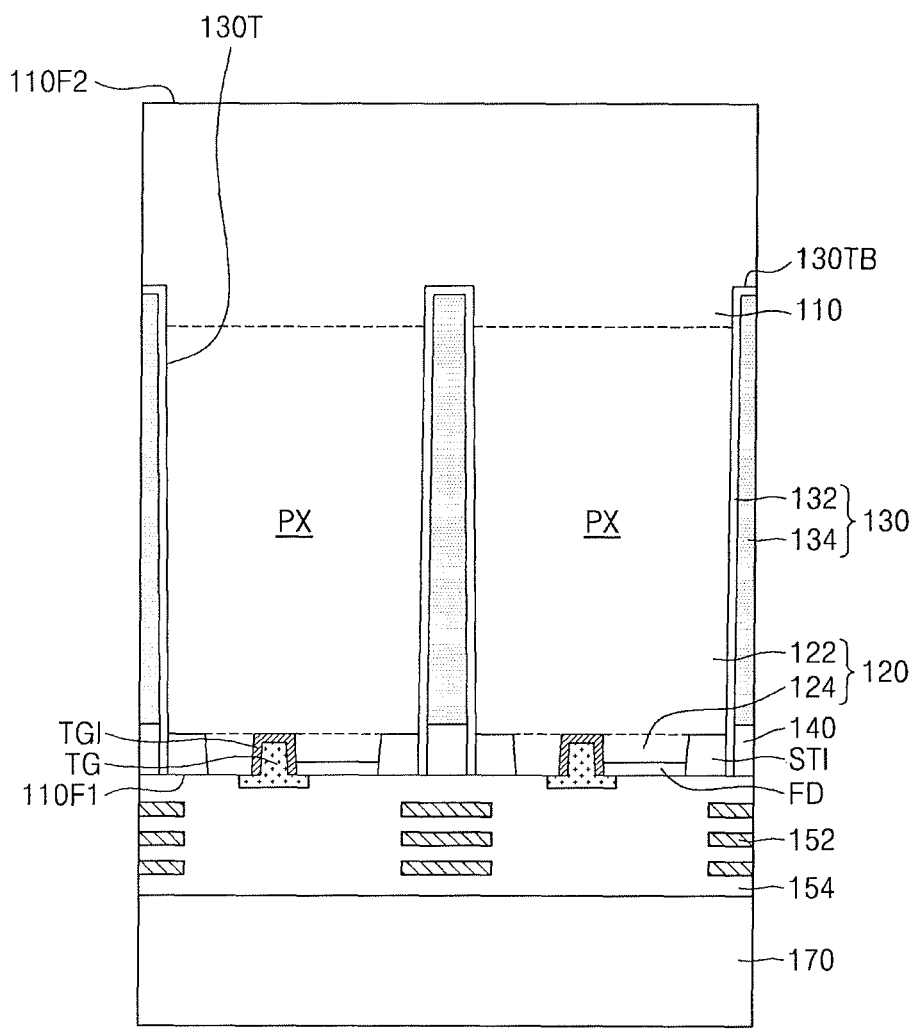

Referring to FIG. 7J, the semiconductor substrate 110 may be inverted such that the second surface 110F2 of the semiconductor substrate 110 faces upward. Herein, the bottom portion 130TB of the pixel trench 130T may not be exposed at the second surface 110F2.

Figure 7K:
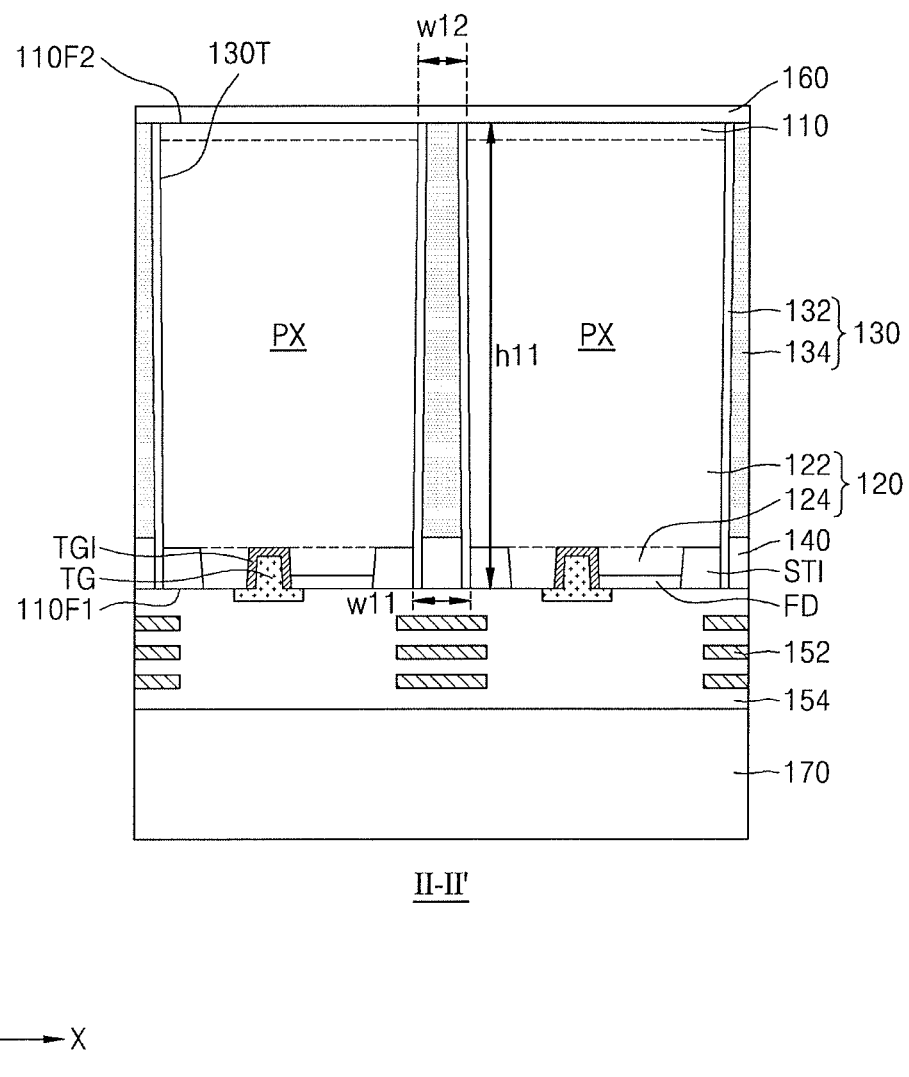

Referring to FIG. 7K, a portion of the semiconductor substrate 110 may be removed from or at the second surface 110F2 of the semiconductor substrate 110 by a planarization process such as a CMP process or an etch-back process until the buried conductive layer 134 is exposed. As the removal process is performed, the level of the second surface 110F2 of the semiconductor substrate 110 may be lowered.

One active pixel PX surrounded by the pixel isolation film 130 may be physically and electrically separated from the active pixel PX adjacent thereto. The pixel trench 130T extends from the first surface 110F1 to the second surface 110F2 of the semiconductor substrate 110 and may have a first height h11 along the vertical direction, the Z direction. In an implementation, the first height h of the pixel trench 130T after the planarization process may be smaller than the first height h01 (see FIG. 7B) of the pixel trench 130T prior to the planarization process. In an implementation, the first height h11 of the pixel trench 130T after the planarization process may be substantially identical to the first height h01 of the pixel trench 130T before the planarization process.

Thereafter, a rear insulating layer 160 may be formed on the second surface 110F2 of the semiconductor substrate 110, the buried conductive layer 134, and the insulating liner 132. The rear insulating layer 160 may be formed using an insulating material such as a metal oxide such as hafnium oxide, aluminum oxide, tantalum oxide, or the like, silicon oxide, silicon nitride, silicon oxynitride, or a low-k material.

Figure 7L:
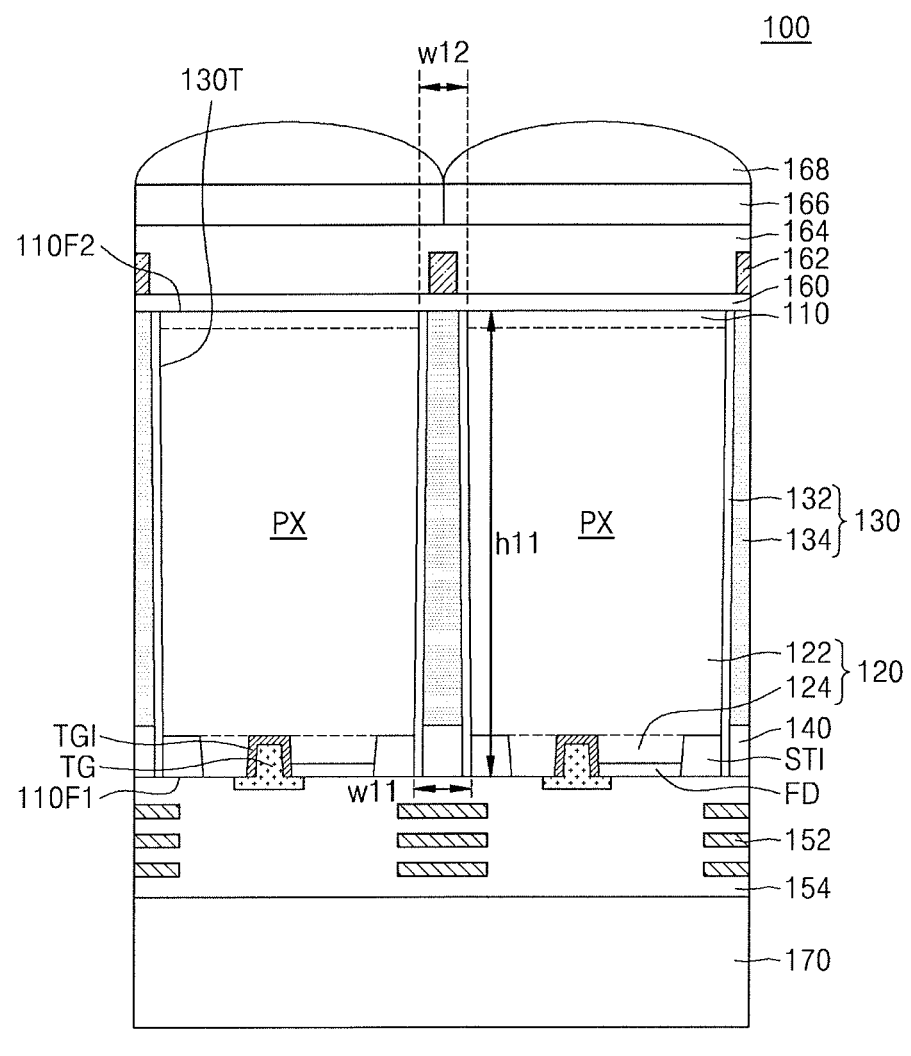

Referring to FIG. 7L, a conductive layer may be formed on the rear insulating layer 160, and the conductive layer may be patterned to form a guide pattern 162. The guide pattern 162 may overlap the pixel isolation film 130 in the active pixel region APR.

Thereafter, a conductive pad PAD (see FIG. 1) may be formed on the rear insulating layer 160 in the pad region PDR. The conductive pad PAD may be formed by sequentially forming a first metal layer and a second metal layer. For example, the first metal layer may be formed using the metal material such as titanium, titanium nitride, tantalum, tantalum nitride, titanium tungsten, tungsten, aluminum, cobalt, nickel or copper by a CVD process, an ALD process or the like. The second metal layer may be formed using the metal material such as tungsten, aluminum, cobalt, nickel, or copper by a CVD process, an ALD process, a plating process, or the like.

Thereafter, a passivation layer 164 may be formed on the rear insulating layer 160 and the guide pattern 162 and a color filter 166 and a microlens 168 may be formed on the passivation layer 164.

The image sensor 100 may be completed by the above-described process.

According to the method of manufacturing the image sensor according to the above-described example embodiments, the buried conductive layer 134 may be formed using polysilicon containing the fining element, and voids or seams may not be formed in the buried conductive layer 134. Further, even though the heat treatment process is further performed, the fining element included in the buried conductive layer 134 may suppress the movement of silicon atoms or inhibit grain growth, and therefore the formation of voids or seams may be prevented inside the buried conductive layer 134.

Figure 8:
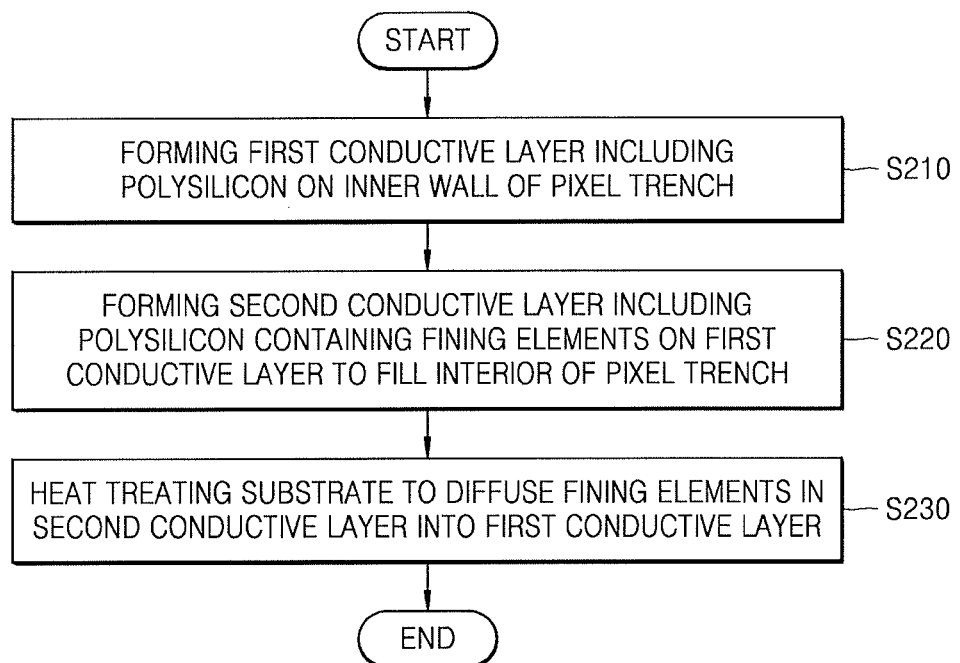
FIG. 8 illustrates a flowchart of a method of manufacturing an image sensor according to example embodiments.
Figure 9A:
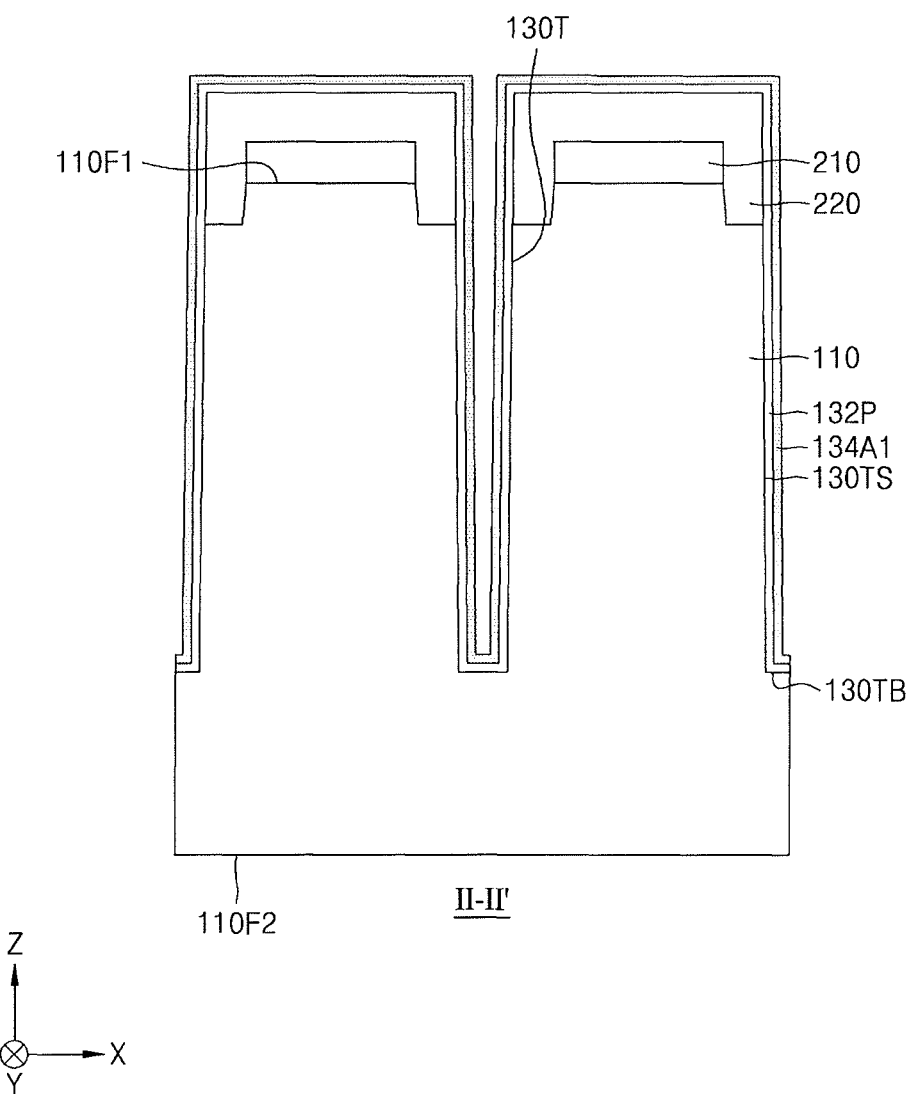
FIGS. 9A-9C illustrate cross-sectional views of stages in a method of manufacturing an image sensor according to example embodiments.
Figure 9B:
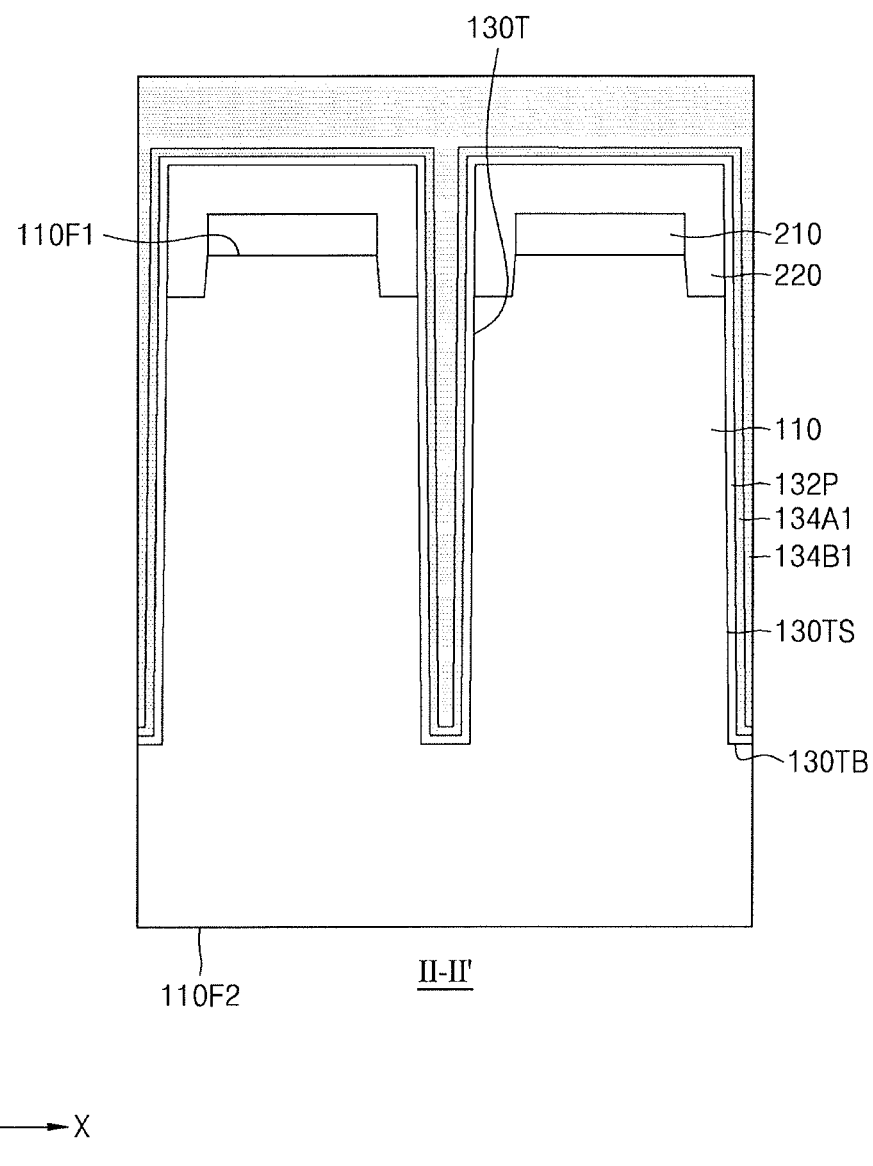
Figure 9C:
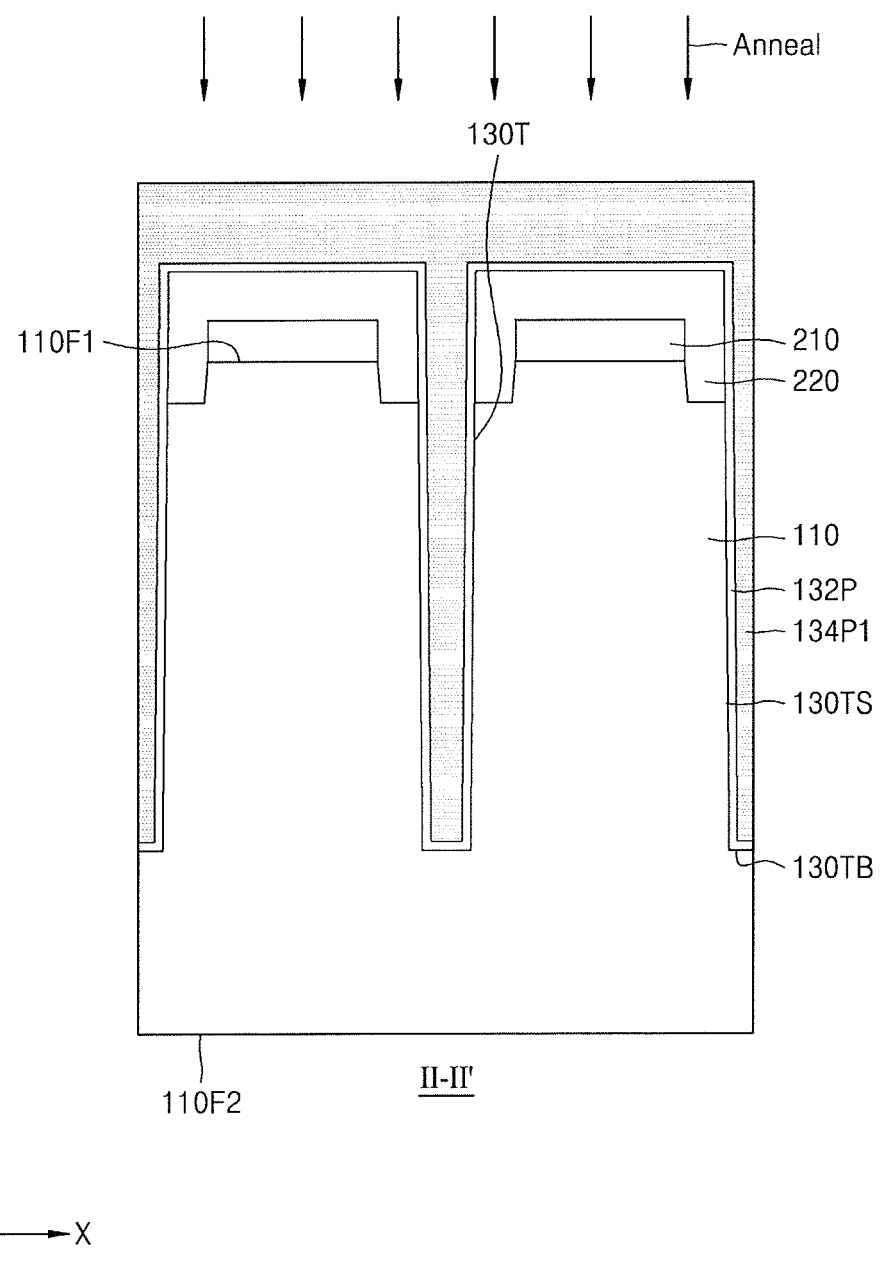

FIG. 8 illustrates a flowchart of a method of manufacturing the image sensor 100 according to the example embodiments. FIGS. 9A to 9C illustrate cross-sectional views of stages in a method of manufacturing the image sensor 100 according to the example embodiments. FIG. 8 and FIGS. 9A to 9C, the same reference numerals as in FIGS. 1 to 7L denote the same elements.

First, the process described with reference to FIGS. 7A to 7C may be performed to form a preliminary insulating liner 132P inside the pixel trench 130T.

Referring to FIGS. 8 and 9A, a first conductive layer 134A1 including polysilicon may be formed on an inner wall of the pixel trench 130T (operation S210). The first conductive layer 134A 1 may include polysilicon that is free of impurities or fining elements.

In an implementation, the first conductive layer 134A1 may be formed by a reaction according to the following Formula 2 using a silicon source material.

$$SiH_4 (g) \rightarrow Si (s) + 2H_2 (g) \qquad \text{Formula 2}$$

Referring to FIGS. 8 and 9B, a second conductive layer 134B1 including polysilicon containing fining elements may be formed on the first conductive layer 134A1 to fill an interior of the pixel trench 130T (operation S220).

In an implementation, when the fining element includes oxygen, the second conductive layer 134B1 may be formed using a silicon source material and an oxygen source material by the reaction according to Formula 1 below.

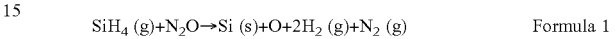

$$SiH_4 (g) + N_2O \rightarrow Si (s) + O + 2H_2 (g) + N_2 (g) \qquad \text{Formula 1}$$

Referring to FIGS. 8 and 9C, the semiconductor substrate 110 may be heat-treated, e.g., annealed (operation S230). The fining element contained in the second conductive layer 134B1 may be diffused into the first conductive layer 134A1 by the heat treatment process, to thereby form a conductive layer 134P1.

In an implementation, the process for forming the first conductive layer 134A1 and the process for forming the second conductive layer 134B1 may be performed in-situ within the same chamber or reactor. In an implementation, the process for forming the first conductive layer 134A1 and the process for forming the second conductive layer 134B1 may be performed ex-situ in different chambers or reactors.

In an implementation, as illustrated in FIGS. 8 and 9A to 9C, the second conductive layer 134B1 may be formed to fill the pixel trench 130T. In an implementation, the first conductive layer 134A1 and the second conductive layer 134B1 having a relatively thin thickness may be alternately and repeatedly formed on the inner wall of the pixel trench 130T. For example, the processes of forming the first conductive layer 134A1 and the second conductive layer 134B1 may be repeated n times to fill the inside of the pixel trench 130T.

Thereafter, the image sensor 100 may be completed by performing the processes described with reference to FIGS. 7E to 7L.

Figure 10:
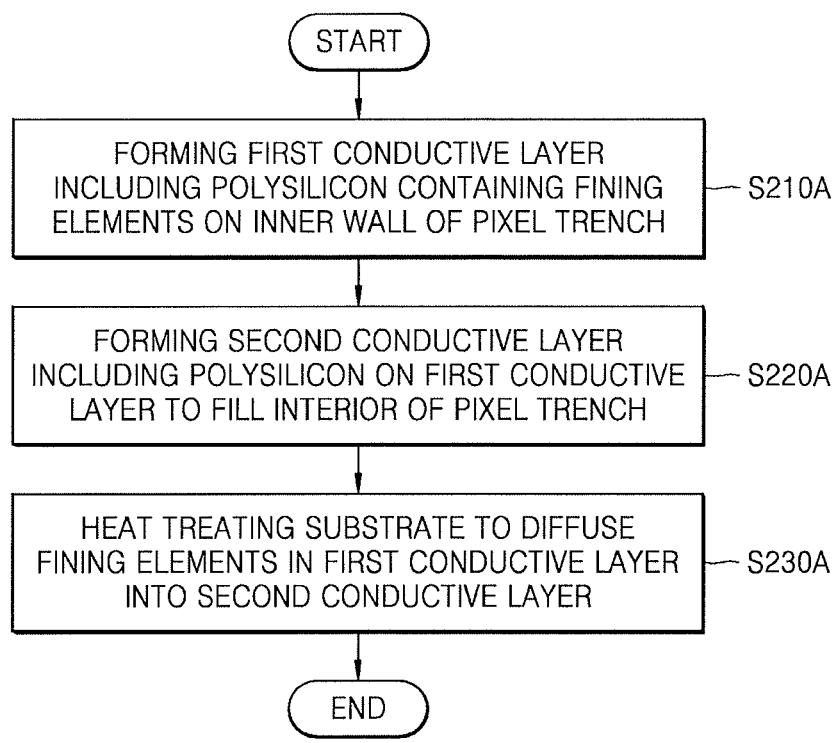
FIG. 10 illustrates a flow chart of a method of manufacturing an image sensor in accordance with example embodiments.

FIG. 10 illustrates a flowchart of a method of manufacturing the image sensor 100 according to the example embodiments.

Referring to FIG. 10 together with FIG. 9A, a first conductive layer 134A1 containing polysilicon containing fining elements may be formed on the inner wall of the pixel trench 130T (operation S210A).

Referring to FIG. 10 together with FIG. 9B, a second conductive layer 134B1 including polysilicon not containing the fining elements or impurities may be formed on the first conductive layer 1341 to fill the inside of the pixel trench 130T (operation S220A).

Referring to FIG. 10 together with FIG. 9C, the semiconductor substrate 110 may be heat-treated (operation S230A). The fining elements included in the first conductive layer 134A1 may be diffused into the second conductive layer 134B1 by the heat treatment process to form the conductive layer 134P1.

FIG. 11 illustrates a flowchart of stages in a method of manufacturing the image sensor 100 according to the example embodiments. FIGS. 12A to 12D illustrate cross-sectional views of stages in a method of manufacturing the image sensor 100 according to example embodiments.

First, the process described with reference to FIGS. 7A to 7C is performed to form a preliminary insulating liner 132P inside the pixel trench 130T.

Figure 12A:
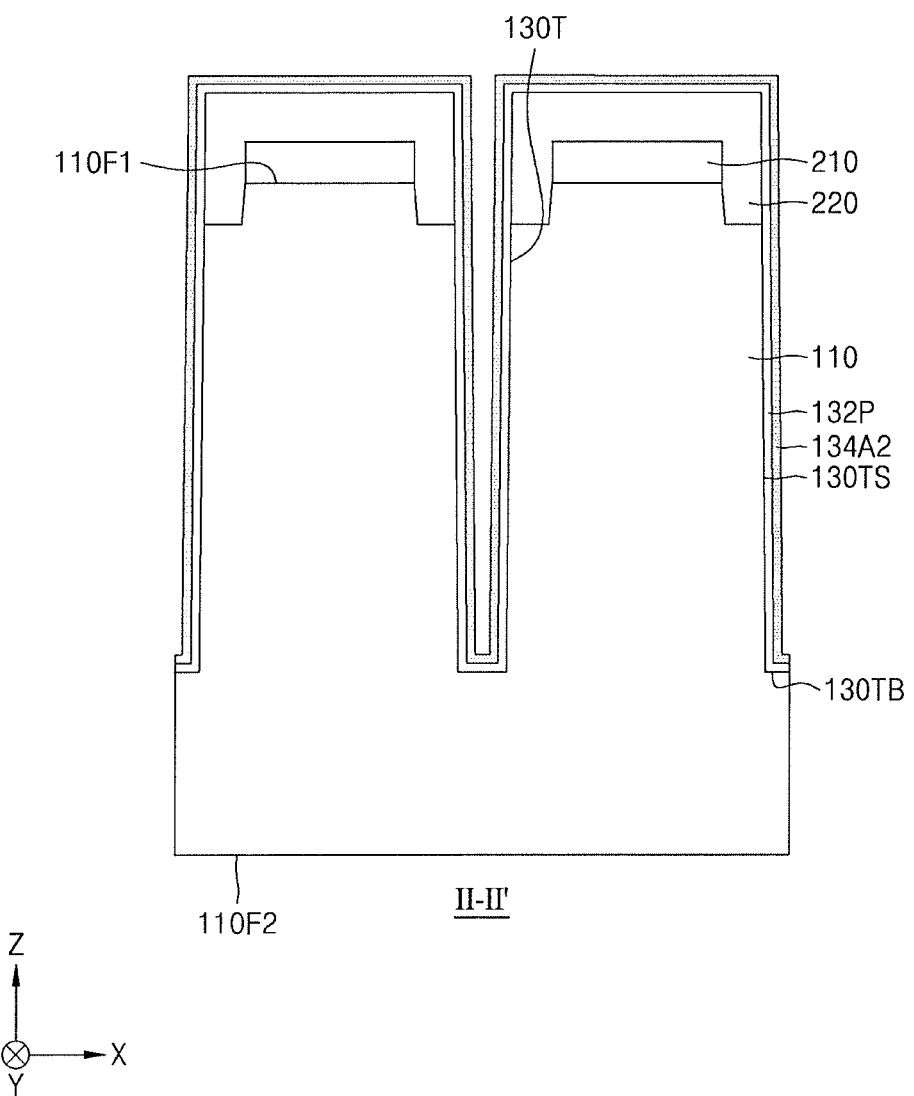
FIGS. 12A-12D illustrate cross-sectional views of stages in a method of manufacturing an image sensor according to example embodiments.

Referring to FIGS. 11 and 12A, a first conductive layer 134A2 including polysilicon may be formed on an inner wall of the pixel trench 130T (operation S210B). The first conductive layer 134A2 may include polysilicon that is free of impurities or fining elements.

Figure 12B:
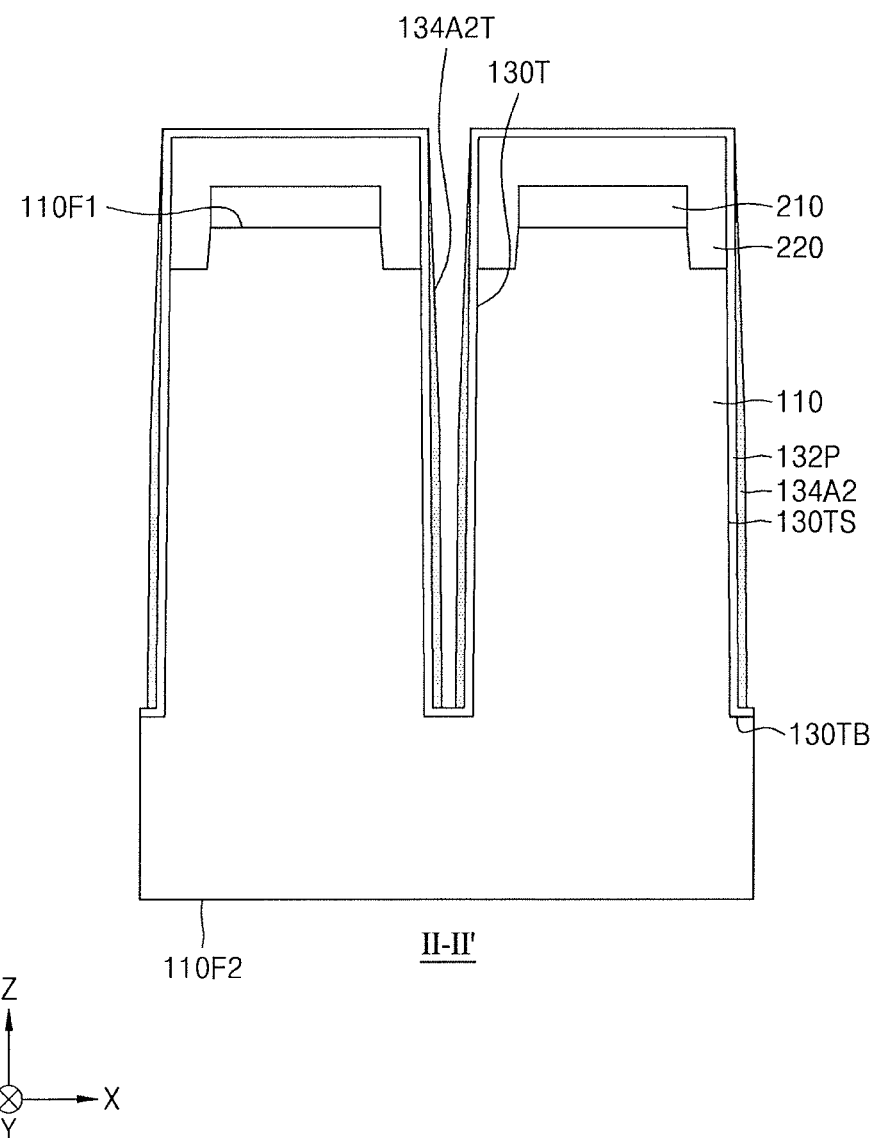

Referring to FIGS. 11 and 12B, an anisotropic etching process may be performed on the first conductive layer 134A2 (operation S215B). A portion of the first conductive layer 134A2 on the preliminary insulating liner 132P on the first surface 110F1 of the semiconductor substrate 110 and a portion of the first conductive layer 134A2 on the bottom portion 130TB of the pixel trench 130T may be removed by the anisotropic etching process. The first conductive layer 134A2 may remain on a sidewall 134A2 may remain and may have a tapered shape in a direction (Z direction) toward the first surface 110F1 of the semiconductor substrate 110 (e.g., in the direction toward an entrance of the pixel trench 130T). As the top portion 134A2T of the first conductive layer 134A2 has a tapered shape, the entrance of the pixel trench 130T may expand laterally as compared to the bottom of the pixel trench 130T.

Figure 12C:
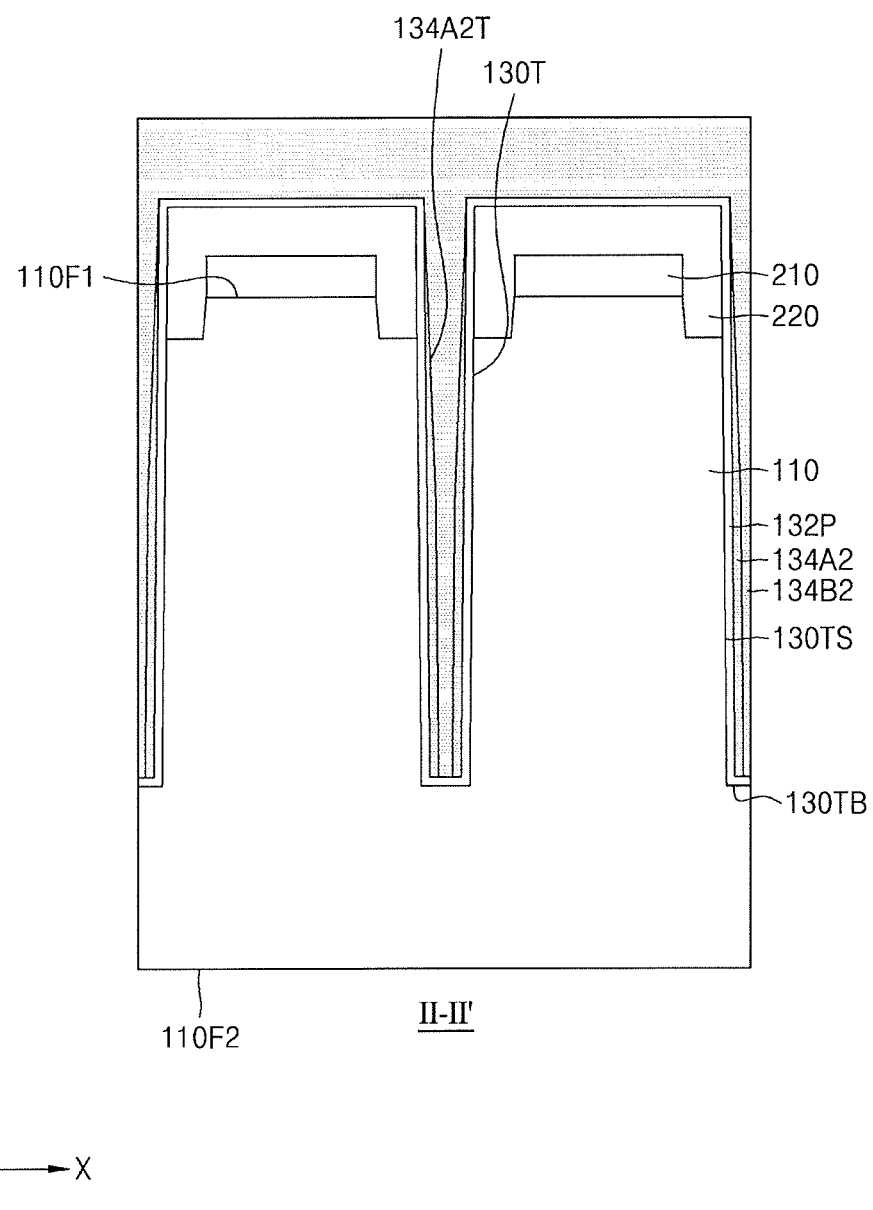

Referring to FIGS. 11 and 12C, a second conductive layer 134B2 including polysilicon containing the fining elements may be formed on the first conductive layer 134A2 to fill the inside of the pixel trench 130T (operation S220B).

As the entrance of the pixel trench 130T expands laterally as compared to the bottom of the pixel trench 130T, the source material may be smoothly supplied to the inside of the pixel trench 130T in the process of forming the second conductive layer 134B2. Thus, the second conductive layer 134B2 may densely fill the inside of the pixel trench 130T without voids or seams.

Figure 12D:
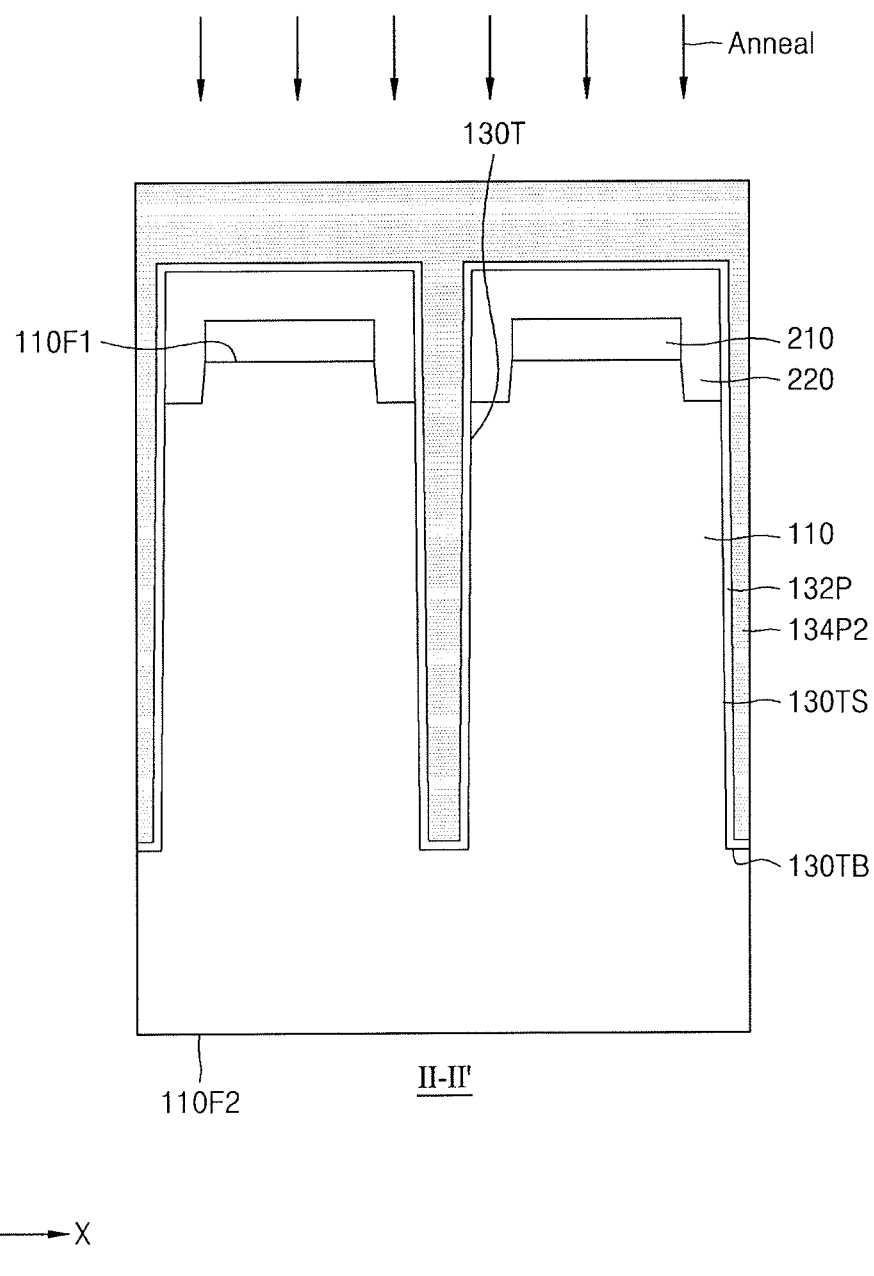

Referring to FIGS. 11 and 12D, the semiconductor substrate 110 may be heat-treated, e.g., annealed (operation S230B). The fining elements included in the second conductive layer 134B2 may be diffused into the first conductive layer 134A2 by the heat treatment process to form the conductive layer 134P2.

In an implementation, the process for forming the first conductive layer 134A2, the process for anisotropically etching the first conductive layer 134A2, and the process for forming the second conductive layer 134B2 may be performed in-situ in a same chamber or reactor. In an implementation, the process for forming the first conductive layer 134A2, the process for anisotropically etching the first conductive layer 134A2, and the process for forming the second conductive layer 134B2 may be performed ex-situ in different chambers or reactors.

In an implementation, as illustrated in FIGS. 11 and 12A to 12D, the second conductive layer 134B2 may include polysilicon containing the fining elements. In an implementation, the first conductive layer 134A2 may include polysilicon containing the fining elements and the second conductive layer 134B2 may include polysilicon that does not contain the fining elements or impurities.

In an implementation, as illustrated in FIGS. 11 and 12A to 12D, the second conductive layer 134B2 may fill the pixel trench 130T. In an implementation, on the inner wall of the pixel trench 130T, the first conductive layer 134A2 and the second conductive layer 134B2 having a relatively thin thickness may be alternately and repeatedly formed. For example, the process of forming the first conductive layer 134A2, the anisotropic etching process of the first conductive layer 134A2, the process of forming the second conductive layer 134B2, and the anisotropic etching process of the second conductive layer 134B2 are repeated n times, and finally, the first conductive layer 134A2 may be formed to fill the inside of the pixel trench 130T.

Thereafter, the image sensor 100 may be completed by performing the processes described with reference to FIGS. 7E to 7L.

Figure 13:
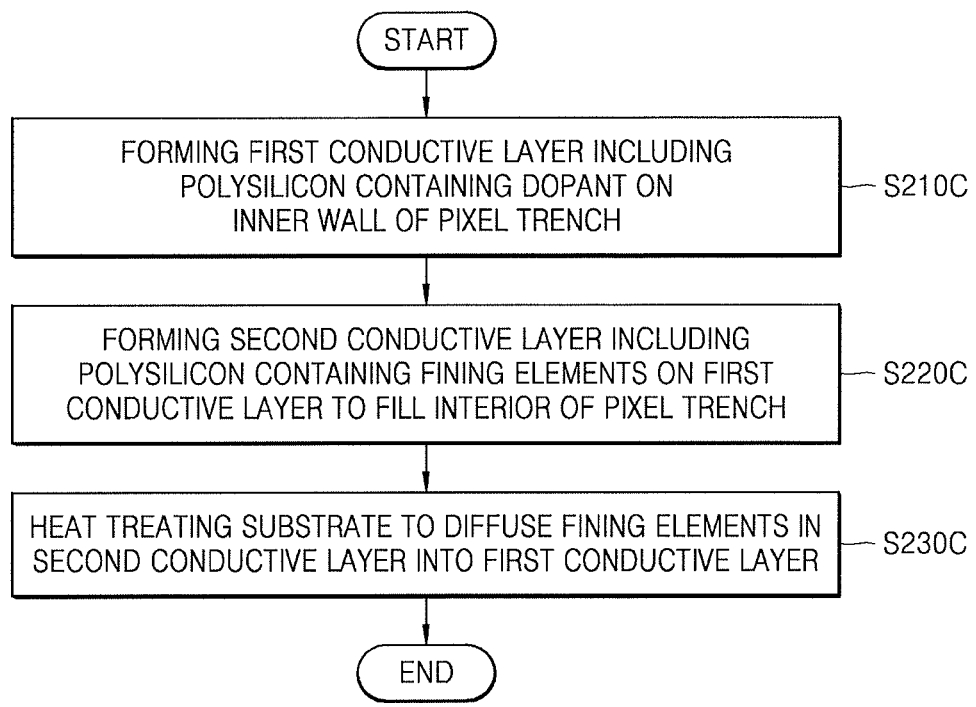
FIG. 13 illustrates a flow chart of a method of manufacturing an image sensor in accordance with example embodiments.

FIG. 13 illustrates a flowchart of a method of manufacturing the image sensor 100A according to the example embodiments.

Referring to FIG. 13 together with FIG. 9A, a first conductive layer 134A1 including polysilicon containing dopant at a second concentration may be formed on the inner wall of the pixel trench 130T (operation S210C). The dopant may include the N-type dopant or the P-type dopant.

In an implementation, the first conductive layer 134A1 may be formed by reactions according to Formula 3 or Formula 4 using the silicon source material and the dopant source material.

$$SiH_4\ (g)+PH_3 \rightarrow Si\ (s)+P+H_2\ (g) \qquad \text{Formula 3}$$

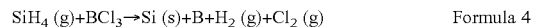

$$SiH_4\ (g)+BCl_3 \rightarrow Si\ (s)+B+H_2\ (g)+Cl_2\ (g) \qquad \text{Formula 4}$$

Referring to FIG. 13 together with FIG. 9B, a second conductive layer 134B1 including polysilicon containing fining elements at the first concentration may formed on the first conductive layer 134A1, to thereby fill the inside of the pixel trench 130T (operation S220C).

Referring to FIG. 13 together with FIG. 9C, the semiconductor substrate 110 may be heat-treated (operation S230C). The dopant contained in the first conductive layer 134A1 may be diffused into the second conductive layer 134B1 by the heat treatment process and the fining elements contained in the second conductive layer 134B1 may be diffused into the first conductive layer 134A1, so that the conductive layer 134P1 may be formed.

Thereafter, the image sensor 100A including the buried conductive layer 134A may be completed by performing the processes described with reference to FIGS. 7E to 7L.

In an implementation, as illustrated in FIG. 13, the dopant and the fining elements may be uniformly dispersed in the entire region of the buried conductive layer 134A by performing the heat treatment process. In an implementation, the heat treatment process of the semiconductor substrate 110 may be omitted and the first conductive layer 134A1 portion may be remained as the interface layer 136B and the second conductive layer 134B1 portion may be remained as the buried conductive layer 134B. In this case, the image sensor 100B described with reference to FIG. 5 may be formed.

Figure 14:
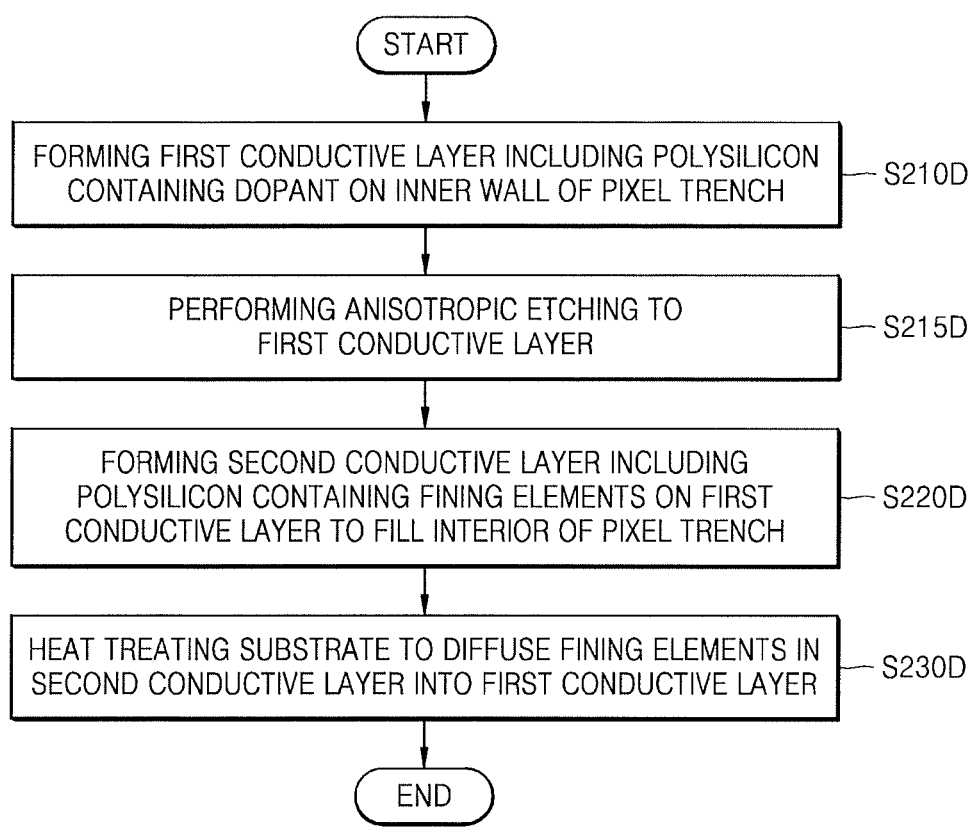
FIG. 14 illustrates a flowchart of a method of manufacturing an image sensor according to example embodiments.

FIG. 14 illustrates a flowchart of a method of manufacturing the image sensor 100A according to the example embodiments.

Referring to FIG. 14 together with FIG. 12A, a first conductive layer 134A2 including polysilicon containing dopants at the second concentration may be formed on the inner wall of the pixel trench 130T (operation S210D). The dopant may include the N-type dopant or the P-type dopant.

Referring to FIG. 14 together with FIG. 12B, an anisotropic etching process may be performed on the first conductive layer 134A2 (operation S215D). The first conductive layer 134A2 may remain on the sidewall 130TS of the pixel trench 130T by the anisotropic etching process and the entrance of the pixel trench 130T may be further expanded laterally as compared to the bottom of the pixel trench 130T.

Referring to FIG. 14 together with FIG. 12C, a second conductive layer 134B2 including polysilicon containing fining elements at a first concentration may be formed on the first conductive layer 134A2 to thereby fill the inside of the pixel trench 130T (operation S220D).

Referring to FIG. 14 together with FIG. 12D, the semiconductor substrate 110 may be heat-treated (operation S230D). The dopants contained in the first conductive layer 134A2 may be diffused into the second conductive layer 134B2 by the heat treatment process and the fining elements contained in the second conductive layer 134B2 may be diffused into the first conductive layer 134A2, so that the conductive layer 134P2 may be formed.

Thereafter, the image sensor 100A including the buried conductive layer 134A may be completed by performing the processes described with reference to FIGS. 7E to 7L.

In an implementation, as illustrated in FIG. 14, the dopants and the fining elements may be uniformly dispersed in the entire region of the buried conductive layer 134A by performing the heat treatment process. In an implementation, the heat treatment process of the semiconductor substrate 110 may be omitted and the portion of the first conductive layer 134A2 may be remained as the interface layer 136C and the portion of the second conductive layer 134B2 may remain as the buried conductive layer 134C. In this case, the image sensor 100C described with reference to FIG. 6 may be formed.

By way of summation and review, as a degree of integration of the image sensor increases, a size of each of the plurality of photodiode regions may be reduced. A degree of difficulty of a process for forming the pixel isolation region may increase.

One or more embodiments may provide an image sensor including a photodiode.

One or more embodiments may provide an image sensor that may fill a buried conductive layer without voids or seams in a pixel isolation region having a large aspect ratio.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An image sensor, comprising:
   a semiconductor substrate having a first surface and a second surface opposite the first surface;
   a transmission gate in a gate trench extending from the first surface of the semiconductor substrate toward an inside of the semiconductor substrate; and
   a pixel isolation film in a pixel trench penetrating through the semiconductor substrate, the pixel isolation film defining active pixels in the semiconductor substrate,
   wherein the pixel isolation film includes:
      an insulating liner on an inner wall of the pixel trench;
      a buried layer on the insulating liner and filling a portion of the pixel trench; and
      a buried insulating layer disposed in a remaining portion of the pixel trench, and
   wherein a portion of the insulating liner is disposed between a sidewall of the buried insulating layer and the inner wall of the pixel trench.

2. The image sensor as claimed in claim 1, wherein
   a first distance from the first surface of the semiconductor substrate to a bottom surface of the buried layer is different from a second distance from the first surface of the semiconductor substrate to a top surface of the transmission gate disposed in the gate trench.

3. The image sensor as claimed in claim 1, wherein:
   the buried layer includes a P-type dopant or an N-type dopant,
   the P-type dopant includes boron, aluminum, or indium, and
   the N-type dopant includes phosphorus, arsenic, or antimony.

4. The image sensor as claimed in claim 1, wherein the pixel trench extends from the first surface of the semiconductor substrate to the second surface of the semiconductor substrate.

5. The image sensor as claimed in claim 4, wherein:
   the insulating liner extends from the first surface of the semiconductor substrate to the second surface of the semiconductor substrate, and
   the insulating liner is in contact with the semiconductor substrate.

6. The image sensor as claimed in claim 5, wherein:
   the buried layer is not in contact with the semiconductor substrate, and
   the buried insulating layer is not in contact with the semiconductor substrate.

7. The image sensor as claimed in claim 1, wherein:
   the buried layer has an average grain size of about 30 nm or less, and
   the buried layer has a full width at half maximum of an X-ray diffraction peak by a silicon (111) crystal plane observed in an X-ray diffraction analysis of about 0.4° to about 1.1°.

8. The image sensor as claimed in claim 1, further comprising:
   an interconnection structure on the first surface of the semiconductor substrate; and
   a microlens on the second surface of the semiconductor substrate,
   wherein the pixel isolation film extends from the first surface to the second surface of the semiconductor substrate and passes through the semiconductor substrate.

9. The image sensor as claimed in claim 1, wherein the pixel trench has a first width at a same level as the first surface of the semiconductor substrate and a second width that is smaller than the first width at a same level as the second surface.

10. The image sensor as claimed in claim 9, wherein a ratio of a first height in a direction perpendicular to the first surface with respect to the first width is about 20 to about 100.

11. An image sensor, comprising:
    a semiconductor substrate having a first surface and a second surface opposite the first surface; and
    a pixel isolation film in a pixel trench, the pixel trench penetrating through the semiconductor substrate, the pixel isolation film defining active pixels in the semiconductor substrate,
    wherein the pixel isolation film includes:
       an insulating liner on an inner wall of the pixel trench;
       a buried layer on the insulating liner and filling a portion of the pixel trench; and
       a buried insulating layer disposed in a remaining portion of the pixel trench, wherein a portion of the insulating liner is disposed between a sidewall of the buried insulating layer and the inner wall of the pixel trench such that the buried insulating layer is not in contact with the semiconductor substrate, and wherein the buried insulating layer vertically overlaps the buried layer.

12. The image sensor as claimed in claim 11, wherein the pixel trench extends from the first surface of the semiconductor substrate to the second surface of the semiconductor substrate.

13. The image sensor as claimed in claim 12, wherein:
the insulating liner extends from the first surface of the semiconductor substrate to the second surface of the semiconductor substrate, and
the insulating liner is in contact with the semiconductor substrate.

14. The image sensor as claimed in claim 13, wherein the buried layer is not in contact with the semiconductor substrate.

15. The image sensor as claimed in claim 11, further comprising:
an interconnection structure on the first surface of the semiconductor substrate; and
a microlens on the second surface of the semiconductor substrate,
wherein the pixel isolation film extends from the first surface to the second surface of the semiconductor substrate and passes through the semiconductor substrate.

16. An image sensor, comprising:
a semiconductor substrate having a first surface and a second surface opposite the first surface;
an isolation film in an isolation trench extending from the first surface of the semiconductor substrate toward an inside of the semiconductor substrate, the isolation film defining an active region in the semiconductor substrate; and
a pixel isolation film in a pixel trench penetrating through the semiconductor substrate, the pixel isolation film defining active pixels in the semiconductor substrate,
wherein the pixel isolation film includes:
an insulating liner on an inner wall of the pixel trench;
a buried layer on the insulating liner and filling a portion of the pixel trench; and
a buried insulating layer disposed in a remaining portion of the pixel trench,
wherein a portion of the insulating liner is disposed between a sidewall of the buried insulating layer and the inner wall of the pixel trench,
wherein a bottom surface of the buried layer is spaced apart from the first surface of the semiconductor substrate, and
wherein a first distance from the first surface of the semiconductor substrate to the bottom surface of the buried layer is greater than a second distance from the first surface of the semiconductor substrate to a top surface of the isolation film.

17. The image sensor as claimed in claim 16, wherein the insulating liner extends from the first surface of the semiconductor substrate to the second surface of the semiconductor substrate.

18. The image sensor as claimed in claim 17, wherein:
the pixel isolation film includes a first end and a second end, the first end is disposed adjacent to the first surface of the semiconductor substrate, the second end is disposed adjacent to the second surface of the semiconductor substrate,
at the first end of the pixel isolation film, both sidewalls of the buried insulating layer are covered by the insulating liner, and
at the second end of the pixel isolation film, both sidewalls of the buried layer are covered by the insulating liner.

19. The image sensor as claimed in claim 18, further comprising:
a rear insulating layer disposed on the second surface of the semiconductor substrate; and
a guide pattern on the rear insulating layer, the guide pattern being at a position vertically overlapping the pixel isolation film.

20. The image sensor as claimed in claim 19, wherein, at the second end of the pixel isolation film, a top surface of the insulating liner is in contact with the rear insulating layer.

* * * * *